(12) United States Patent
Kim et al.

(10) Patent No.: US 10,347,611 B2
(45) Date of Patent: Jul. 9, 2019

(54) SEMICONDUCTOR PACKAGES HAVING REDISTRIBUTION SUBSTRATE

(71) Applicant: Samsung Electronics Co., Ltd., Suwon-si OT (KR)

(72) Inventors: Jichul Kim, Yongin-si (KR); Jae Choon Kim, Incheon (KR); Hansung Ryu, Seoul (KR); KyongSoon Cho, Incheon (KR); YoungSang Cho, Yongin-si (KR); Yeo-Hoon Yoon, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/406,925

(22) Filed: Jan. 16, 2017

(65) Prior Publication Data
US 2017/0207205 A1    Jul. 20, 2017

Related U.S. Application Data

(60) Provisional application No. 62/278,523, filed on Jan. 14, 2016.

(30) Foreign Application Priority Data

May 16, 2016 (KR) .................. 10-2016-0059712

(51) Int. Cl.
*H01L 23/48* (2006.01)
*H01L 25/10* (2006.01)
(Continued)

(52) U.S. Cl.
CPC .......... *H01L 25/105* (2013.01); *H01L 21/486* (2013.01); *H01L 21/4857* (2013.01);
(Continued)

(58) Field of Classification Search
CPC ... H01L 25/105; H01L 23/5383; H01L 25/50; H01L 24/20; H01L 21/486; H01L 21/561;
(Continued)

(56) References Cited

U.S. PATENT DOCUMENTS 5,478,781 A * 12/1995 Bertin ................. H01L 25/0657
257/E21.705
6,060,778 A * 5/2000 Jeong ..................... H01L 23/13
257/697
(Continued)

FOREIGN PATENT DOCUMENTS

| JP | 2013-182974 A | 9/2013 |
|----|---------------|--------|
| KR | 10-2010-0009941 A | 1/2010 |
| KR | 10-2014-0094081 A | 7/2014 |

*Primary Examiner* — Anthony Ho
*Assistant Examiner* — Mohammad M Hoque
(74) *Attorney, Agent, or Firm* — Muir Patent Law, PLLC

(57) ABSTRACT

A semiconductor package is provided which includes a redistribution substrate, an interconnect substrate on the redistribution substrate, a metal layer on the semiconductor chip, a semiconductor chip on the redistribution substrate and in the hole of the interconnect substrate, and a mold layer in a gap between the semiconductor chip and the interconnect substrate. The interconnect substrate includes a hole penetrating thereinside. The interconnect substrate includes base layers and a conductive member extending through the base layers. A top surface of the interconnect substrate is positioned either above or below the level of the top surface of the metal layer.

19 Claims, 28 Drawing Sheets

(51) Int. Cl.
  *H01L 21/48*  (2006.01)
  *H01L 21/56*  (2006.01)
  *H01L 23/538* (2006.01)
  *H01L 23/00*  (2006.01)
  *H01L 25/00*  (2006.01)
  *H01L 23/498* (2006.01)
  *H01L 29/06*  (2006.01)

(52) U.S. Cl.
  CPC .......... *H01L 21/561* (2013.01); *H01L 21/565* (2013.01); *H01L 21/568* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/50* (2013.01); *H01L 23/49816* (2013.01); *H01L 23/5383* (2013.01); *H01L 23/5384* (2013.01); *H01L 24/16* (2013.01); *H01L 24/32* (2013.01); *H01L 24/48* (2013.01); *H01L 24/73* (2013.01); *H01L 24/83* (2013.01); *H01L 24/92* (2013.01); *H01L 29/0657* (2013.01); *H01L 2224/04105* (2013.01); *H01L 2224/08146* (2013.01); *H01L 2224/12105* (2013.01); *H01L 2224/16227* (2013.01); *H01L 2224/32245* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2224/94* (2013.01); *H01L 2224/95001* (2013.01); *H01L 2224/97* (2013.01); *H01L 2225/1035* (2013.01); *H01L 2225/1041* (2013.01); *H01L 2225/1058* (2013.01); *H01L 2225/1088* (2013.01); *H01L 2225/1094* (2013.01); *H01L 2924/00014* (2013.01); *H01L 2924/10253* (2013.01); *H01L 2924/1432* (2013.01); *H01L 2924/1434* (2013.01); *H01L 2924/15311* (2013.01); *H01L 2924/181* (2013.01); *H01L 2924/1815* (2013.01); *H01L 2924/3025* (2013.01); *H01L 2924/3511* (2013.01)

(58) Field of Classification Search
  CPC ............. H01L 21/568; H01L 23/49816; H01L 29/0657; H01L 23/5384; H01L 23/5389; H01L 24/19; H01L 24/96; H01L 24/97; H01L 21/565; H01L 21/4857
  USPC ......................................................... 257/774
  See application file for complete search history.

(56) References Cited

U.S. PATENT DOCUMENTS

| | | | |
|---|---|---|---|
| 6,607,938 B2 | 8/2003 | Kwon et al. | |
| 7,626,254 B2 | 12/2009 | O et al. | |
| 8,409,920 B2 | 4/2013 | Pendse et al. | |
| 8,686,556 B2 | 4/2014 | Clark et al. | |
| 8,860,217 B1 | 10/2014 | Chen et al. | |
| 8,994,193 B2 | 3/2015 | Tateiwa et al. | |
| 9,129,870 B2 | 9/2015 | Zeng | |
| 9,530,741 B2* | 12/2016 | Kim | H01L 23/562 |
| 9,653,411 B1* | 5/2017 | Lu | H01L 23/562 |
| 2003/0146520 A1 | 8/2003 | Fang | |
| 2004/0178508 A1* | 9/2004 | Nishimura | H01L 23/3128 257/778 |
| 2006/0202353 A1 | 9/2006 | Wakabayashi et al. | |
| 2007/0096305 A1* | 5/2007 | Fuergut | H01L 21/6835 257/734 |
| 2007/0181339 A1* | 8/2007 | Ren | H01L 23/552 174/350 |
| 2007/0230130 A1* | 10/2007 | Alcoe | H01L 23/3735 361/704 |
| 2008/0258286 A1* | 10/2008 | Gerber | H01L 25/105 257/686 |
| 2010/0072588 A1* | 3/2010 | Yang | H01L 23/49816 257/676 |
| 2010/0224354 A1* | 9/2010 | Dooley | B32B 37/025 165/185 |
| 2011/0045634 A1 | 2/2011 | Pagaila | |
| 2011/0193203 A1* | 8/2011 | Goto | H01L 23/5389 257/659 |
| 2011/0210436 A1* | 9/2011 | Chow | H01L 21/563 257/686 |
| 2011/0227209 A1* | 9/2011 | Yoon | H01L 23/3128 257/686 |
| 2012/0009813 A1* | 1/2012 | Tsai | H05K 7/1007 439/347 |
| 2012/0175664 A1* | 7/2012 | Lin | F21K 9/90 257/99 |
| 2012/0313226 A1* | 12/2012 | Koizumi | H01L 23/49827 257/659 |
| 2013/0127054 A1* | 5/2013 | Muthukumar | H01L 23/3121 257/738 |
| 2013/0161836 A1* | 6/2013 | Yeom | H01L 25/105 257/778 |
| 2014/0077394 A1 | 3/2014 | Chang et al. | |
| 2014/0159222 A1* | 6/2014 | Hong | H01L 23/13 257/686 |
| 2014/0175624 A1* | 6/2014 | Palm | H01L 24/96 257/666 |
| 2014/0185264 A1* | 7/2014 | Chen | H01L 23/3128 361/814 |
| 2014/0321069 A1* | 10/2014 | Gouchi | H05K 1/16 361/728 |
| 2015/0008566 A1* | 1/2015 | Gerber | H01L 24/97 257/668 |
| 2015/0108604 A1* | 4/2015 | Nakamura | H01L 23/481 257/532 |
| 2015/0155243 A1* | 6/2015 | Chen | H01L 23/562 257/724 |
| 2015/0187675 A1* | 7/2015 | Tang | H01L 23/367 257/712 |

* cited by examiner

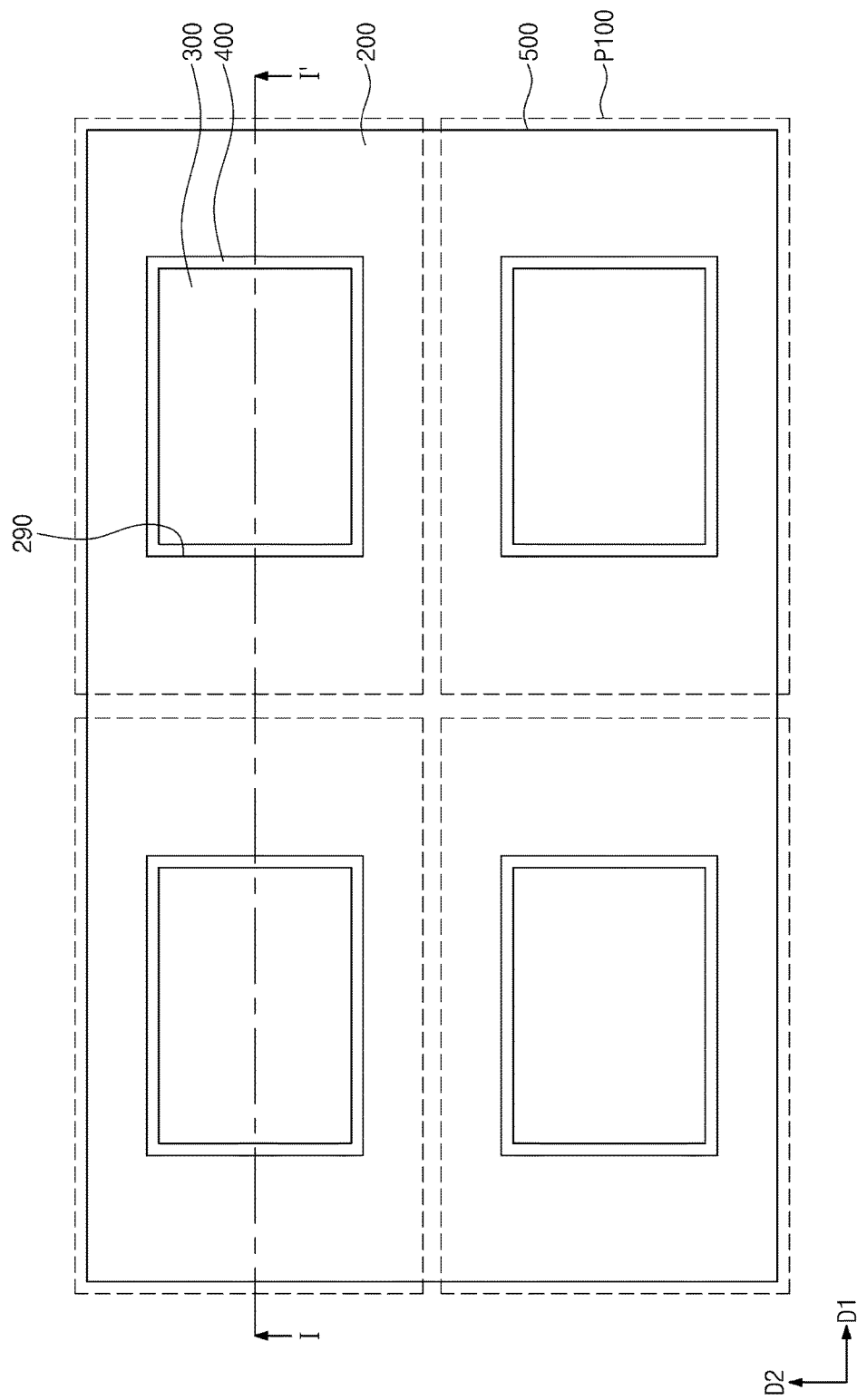

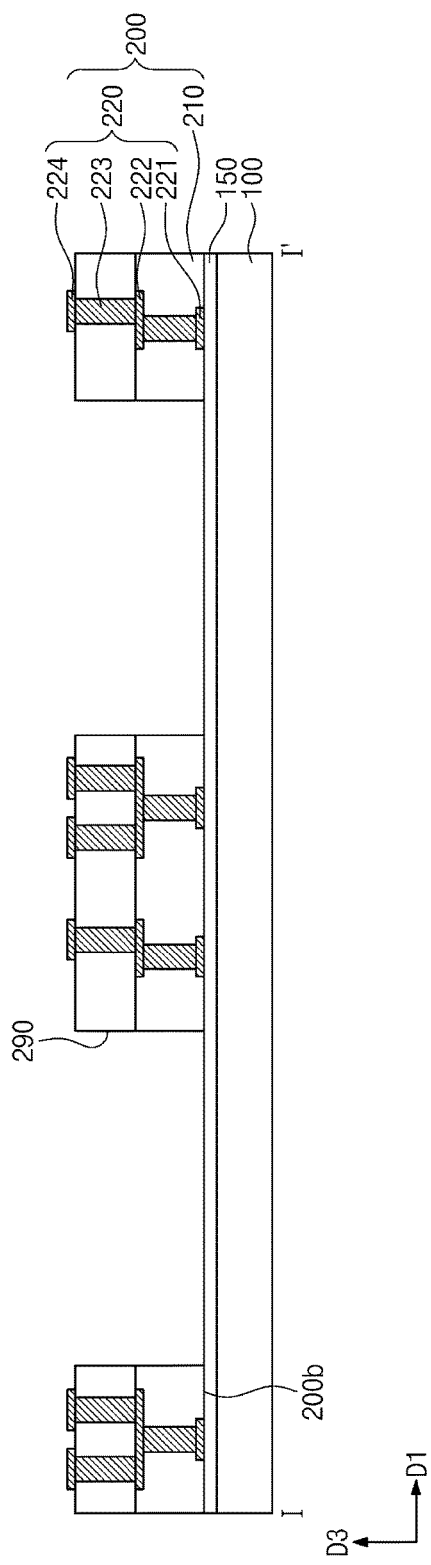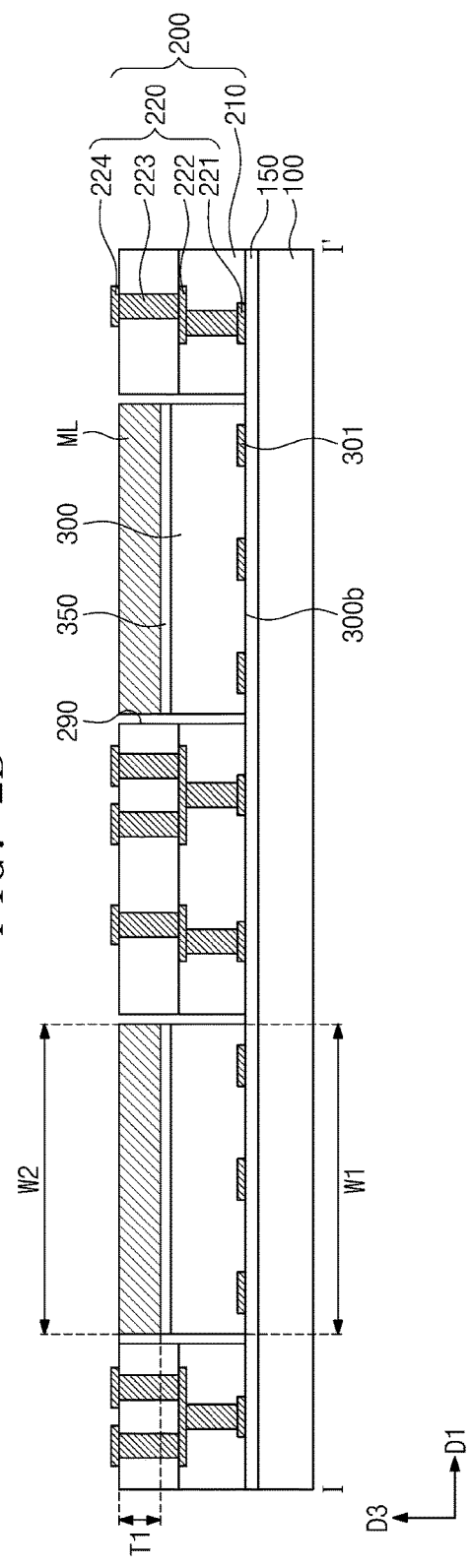

SEMICONDUCTOR PACKAGES HAVING REDISTRIBUTION SUBSTRATE

CROSS-REFERENCE TO RELATED APPLICATIONS

This U.S. nonprovisional patent application claims benefit of U.S. provisional Patent Application Ser. No. 62/278,523 filed on Jan. 14, 2016 and priority under 35 U.S.C. § 119 of Korean Patent Application 10-2016-0059712 filed on May 16, 2016, the entire contents of which are hereby incorporated by reference.

BACKGROUND

The below described exemplary embodiments of the herein described subject matter relate to a semiconductor package and, more particularly, to a semiconductor package including a redistribution substrate.

A semiconductor package is provided to implement an integrated circuit chip to be suitable for use in an electronic appliance. Typically, in a semiconductor package, semiconductor chips are mounted on a printed circuit board (PCB) and bonding wires or bumps are used to electrically connect the semiconductor chips to the printed circuit board. With the advent of electronic products requiring greater integration, resulting in greater density of semiconductor chips mounted on printed circuit boards, there have been correspondingly increasingly demands for high performance, high speed and compact size of the semiconductor chips and printed circuit boards. As a result, semiconductor packages have a warpage problem in keeping with their required compact size.

SUMMARY

The exemplary embodiments disclosed below provide a semiconductor package capable of preventing warpage.

The exemplary embodiments described below provide a semiconductor package having a compact size.

According to exemplary embodiments, a semiconductor package may comprise: a redistribution substrate; an interconnect substrate on the redistribution substrate, the interconnect substrate including a hole penetrating thereinside; a semiconductor chip on the redistribution substrate and in the hole of the interconnect substrate; a metal layer on the semiconductor chip; and a mold layer in a gap between the semiconductor chip and the interconnect substrate. The interconnect substrate may include base layers and a conductive member extending through the base layers. A top surface of the interconnect substrate may be positioned at a level lower than that of a top surface of the metal layer.

The interconnect substrate may surround the semiconductor chip on all sides, and the mold layer may surround the semiconductor chip on all sides and extend over the top surface of the semiconductor chip. The mold layer may be formed of a continuous homogeneous material such as epoxy or the like.

According to exemplary embodiments, a semiconductor package may comprise: a substrate; a semiconductor chip on the substrate; a first metal layer on the semiconductor chip; an interconnect substrate that is disposed side by side with the semiconductor chip on the substrate and surrounds the semiconductor chip in plan view; and a mold layer in a gap between the semiconductor chip and the interconnect substrate. The interconnect substrate may include a base layer and a conductive member extending through the base layer.

BRIEF DESCRIPTION OF THE DRAWINGS

FIG. 1A is a plan view illustrating a method for manufacturing a semiconductor package according to exemplary embodiments.

FIGS. 2A to 2F are cross-sectional views illustrating a method for manufacturing a semiconductor package according to exemplary embodiments.

DETAILED DESCRIPTION OF EMBODIMENTS

Figure 1B:
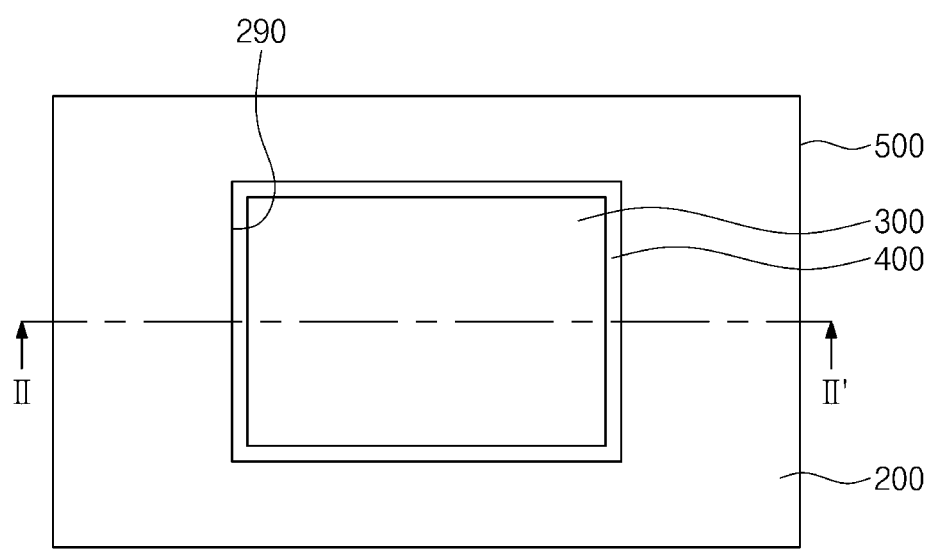
FIG. 1B is a plan view illustrating a first package according to exemplary embodiments.

The present disclosure now will be described more fully hereinafter with reference to the accompanying drawings, in which various exemplary implementations are shown. The invention may, however, be embodied in many different forms and should not be construed as limited to the example embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary embodiments, when taking the figures and their description as a whole into consideration.

Although the figures described herein may be referred to using language such as "one exemplary embodiment," or "certain exemplary embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

FIG. 1A is a plan view illustrating a method for manufacturing a semiconductor package according to exemplary embodiments. FIG. 1B is a plan view illustrating a first package according to exemplary embodiments. FIGS. 2A to 2F are cross-sectional views illustrating a method for manufacturing a semiconductor package according to exemplary embodiments. FIGS. 2A to 2E correspond to cross-sectional views taken along line I-I' of FIG. 1A, and FIGS. 2F and 2G correspond to cross-sectional views taken along line II-II' of FIG. 1B.

As shown in FIGS. 1A and 2A, an interconnect substrate 200 may be provided on a carrier substrate 100. The interconnect substrate 200 may be adhered to the carrier substrate 100 through a carrier glue layer 150. The interconnect substrate 200 may include a hole 290 penetrating thereinside. The interconnect substrate 200 may include base layers 210 and a conductive member 220 extending through the base layers 210. For example, a printed circuit board (PCB) may be used as the interconnect substrate 200. The conductive member 220 may include lower pads 221, a line pattern 222, vias 223, and upper pads 224. The lower pads 221 may be disposed on a bottom surface 200b of the interconnect substrate 200. The vias 223 may penetrate at least one of the base layers 210. The line pattern 222 may be interposed between the base layers 210 and connected to the vias 223. The upper pads 224 may be provided on a top surface of the base layers 210 and connected to at least one of the vias 223. The upper pads 224 may be electrically connected to the lower pads 221 through the line pattern 222 and the vias 223. The upper pads 224 may not be aligned with the lower pads 221 in a third direction D3. In this description, the third direction D3 may be defined perpendicular to the bottom surface 200b of the interconnect substrate 200, and a first direction D1 and a second direction D2 may be defined parallel to the bottom surface 200b of the interconnect substrate 200. The first direction D1 may cross the second direction D2.

As shown in FIGS. 1A and 2B, a first semiconductor chip 300 may be provided on the carrier substrate 100. The first semiconductor chip 300 may be provided in the hole 290 of the interconnect substrate 200. The first semiconductor chip 300 may include first chip pads 301 disposed on a bottom surface 300b thereof. The first chip pads 301 may face toward the carrier substrate 100. The first semiconductor chip 300 may include silicon.

A metal layer ML may be disposed on the first semiconductor chip 300. The metal layer ML may include copper or aluminum. The metal layer ML may have a thickness T1 in the range from about 15 μm to about 25 μm. The metal layer ML may have a relatively high modulus. For example, the metal layer ML may have a modulus of about more than about 50 GPa, in detail, in the range from about 50 GPa to about 200 GPa. The modulus may mean a Young's modulus. When a pressure is applied to substance, a deformation degree of the substance may decrease as increasing of its Young's modulus. An adhesive layer 350 may be formed between the first semiconductor chip 300 and the metal layer ML, so that the metal layer ML may be affixed to the first semiconductor chip 300. Hereinafter, a formation of the metal layer ML is further discussed in detail below.

Figure 3A:
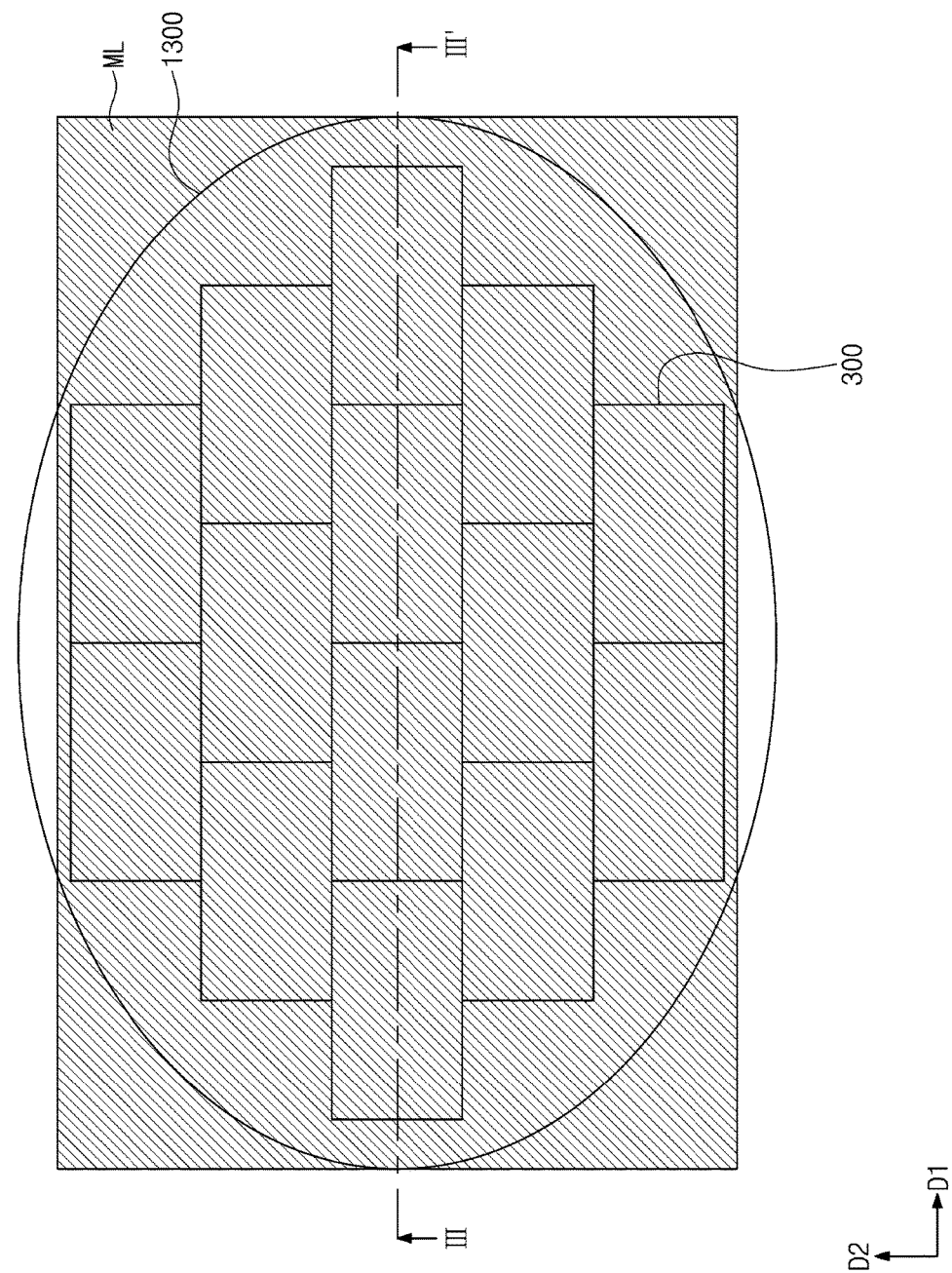
FIG. 3A is a plan view for explaining a method for fabricating a metal layer according to exemplary embodiments.
Figure 3B:
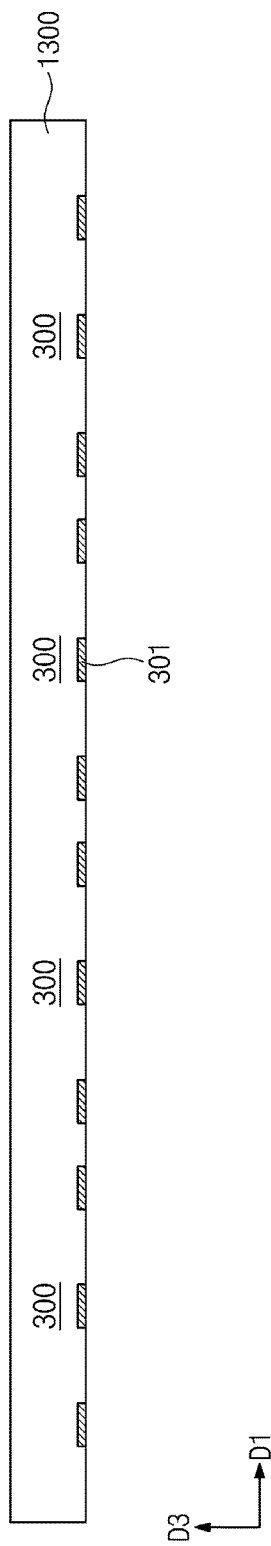
FIGS. 3B to 3D are cross-sectional views, corresponding to cross-sectional views taken along line III-III' of FIG. 3A, illustrating a method for fabricating a metal layer.
Figure 3C:
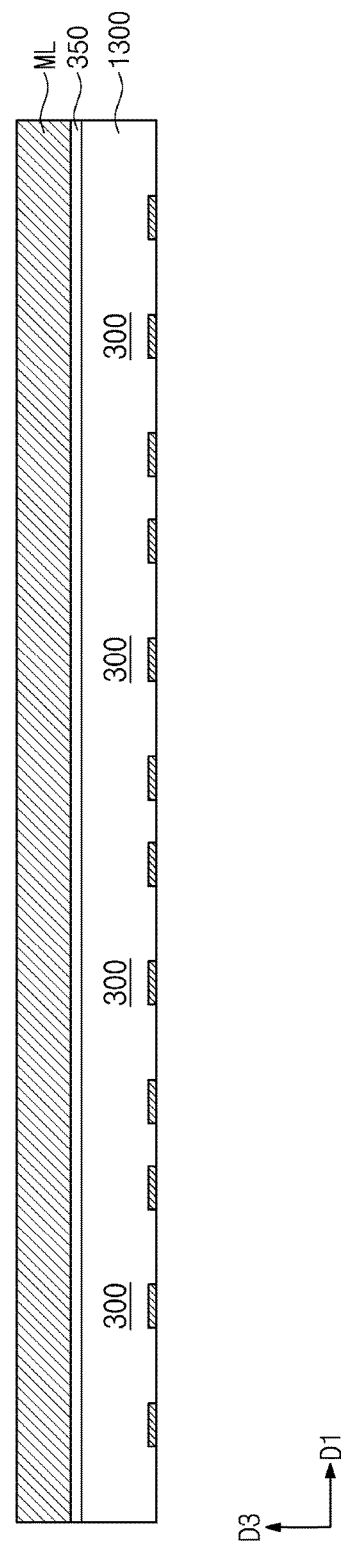
Figure 3D:
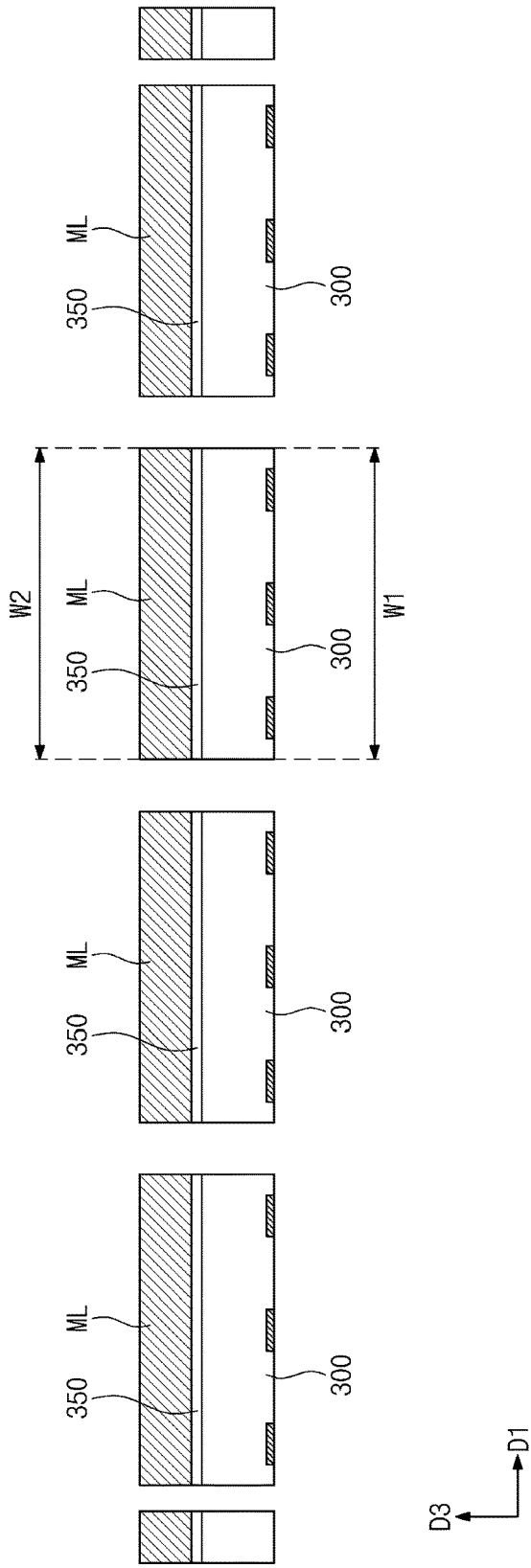

FIG. 3A is a plan view for explaining a method for forming a metal layer according to exemplary embodiments. FIGS. 3B to 3D are cross-sectional views, corresponding to cross-sectional views taken along line III-III' of FIG. 3A, illustrating a method for forming a metal layer.

As shown in FIGS. 3A and 3B, a semiconductor substrate 1300 may be provided to include the first semiconductor chip 300. A plurality of first semiconductor chips 300 may be provided in the semiconductor substrate 1300. The semiconductor chip 1300 may be a wafer-level substrate formed of a semiconductor such as silicon. The first semiconductor chip 300 may include first chip pads 301.

As shown in FIGS. 3A and 3C, the metal layer ML may be provided on the semiconductor substrate 1300 and cover top surfaces of the first semiconductor chips 300. The metal layer ML may be illustrated to have a planar shape different from that of the semiconductor substrate 1300, but the present exemplary embodiments are not limited thereto. The adhesive layer 350 may be formed between the first semiconductor chips 300 and the metal layer ML. The adhesive layer 350 may be a thermosetting polymer or a thermoplastic polymer. For example, the adhesive layer 350 may be heated to more than about 150° C., in detail, in the range from about 150° C. to about 250° C., and then cooled to a room temperature (e.g., about 0° C. to about 50° C.). The adhesive layer 350 may be plastically deformed to solidify through the heating and cooling. Alternatively, without forming the adhesive layer 350, a seed layer (not shown) may be formed on the first semiconductor chips 300. The seed layer may include titanium. The metal layer ML may be formed on the seed layer by a sputtering or plating process. In certain embodiments, the metal layer ML may be formed by a spray coating process, in detail, a cold spray coating process. In this case, the adhesive layer 350 and the seed layer may not be formed and the metal layer ML may be in physical direct contact with the first semiconductor chips 300.

As shown in FIGS. 3A and 3D, the metal layer ML and the semiconductor substrate 1300 may be sawed such that the first semiconductor chips 300 may be separated from each other. After sawing, each of the first semiconductor chips 300 may have a width W1 substantially the same as a width W2 of the metal layer ML disposed on a top surface of the each of the first semiconductor chips 300. A single one of the first semiconductor chips 300 will be hereinafter discussed.

As shown in FIG. 2B together with FIG. 3C, the first semiconductor chip 300 on which the metal layer ML is provided may be disposed on the carrier substrate 100. The first semiconductor chip 300 may face the carrier substrate 100. The first semiconductor chip 300 and the metal layer ML on the top surface thereof may be disposed on the carrier substrate 100 at substantially the same time. However, the formation of the first semiconductor chip 300 and the metal layer ML may be variously changed without being limited to the exemplary embodiments explained in FIGS. 3A to 3C. For example, the first semiconductor chip 300 may be in advance disposed on the carrier substrate 100, and then the metal layer ML may be disposed on the first semiconductor chip 300. In this case, the width W2 of the metal layer ML may be substantially the same as or different from the width W1 of a corresponding first semiconductor chip 300. Alternatively, the arrangement of the first semiconductor chip 300 illustrated in FIG. 2B may be carried out prior to the arrangement of the interconnect substrate 200 illustrated in FIG. 2A. In this case, the first semiconductor chip 300 may be disposed on the carrier substrate 100 and the interconnect substrate 200 may be disposed on the carrier substrate 100 so as to align the hole 290 with the first semiconductor chip 300.

Figure 2C:
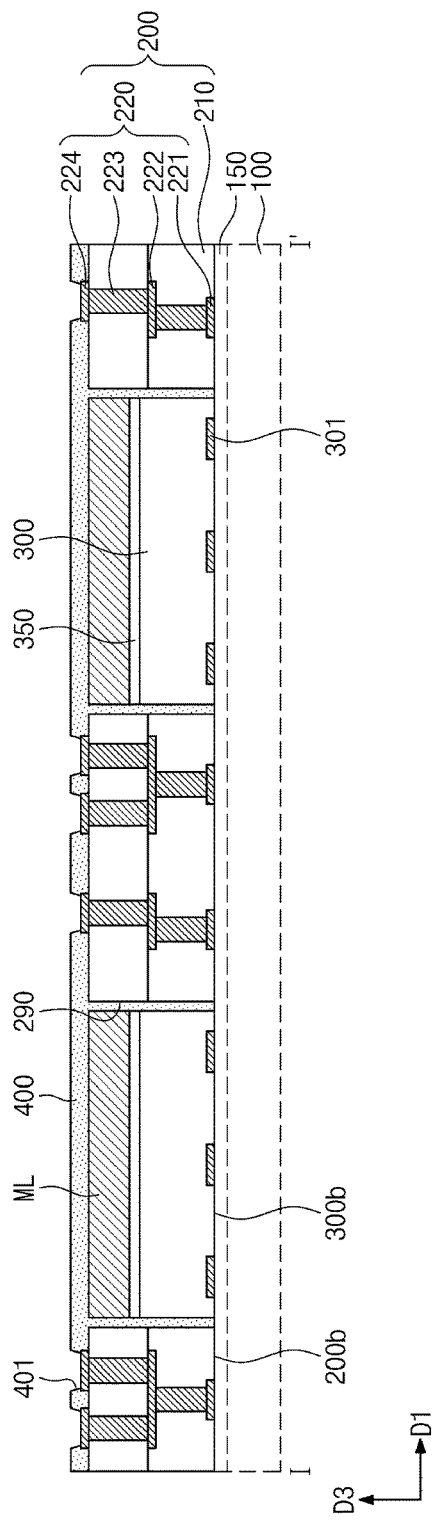

As shown in FIGS. 1A and 2C, a first mold layer 400 may be formed on the carrier substrate 100. The first mold layer 400 may cover the top surface of the interconnect substrate 200 and a top surface of the metal layer ML. The first mold layer 400 may be provided in a gap between the interconnect substrate 200 and the metal layer ML and a gap between the interconnect substrate 200 and the first semiconductor chip 300. The first mold layer 400 may include an insulative polymer, for example, an epoxy-based polymer. An opening 401 may be formed in the first mold layer 400 so that the upper pads 224 may be exposed. Alternatively, the opening 401 may not be formed. As shown in dotted line, the carrier substrate 100 and the carrier glue layer 150 may be removed to expose the bottom surface 300b of the first semiconductor chip 300 and the bottom surface 200b of the interconnect substrate 200.

Figure 2D:
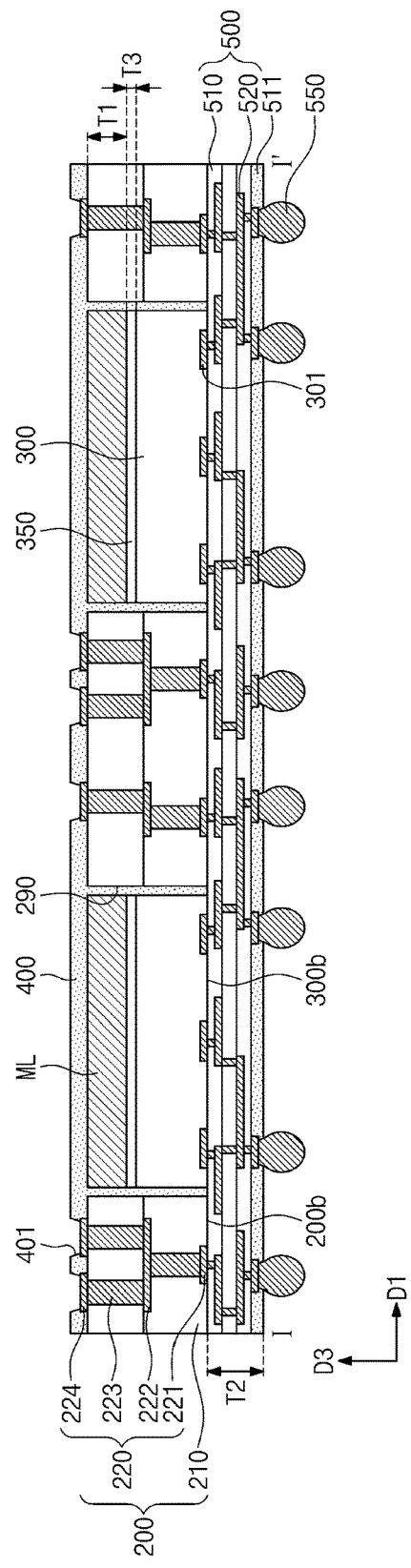

As shown in FIGS. 1A and 2D, insulative patterns 510 and conductive patterns 520 may be formed on the bottom surface 300b of the first semiconductor chip 300 and the bottom surface 200b of the interconnect substrate 200, thereby fabricating a first substrate 500. The first substrate 500 may be a redistribution substrate. The conducive pattern 520 may include a conductive layer that is disposed between the insulative patterns 510 and a via that penetrates the insulative patterns 510. The conductive pattern 520 may be connected to the first chip pads 301 of the first semiconductor chip 300 and the lower pads 221 of the interconnect substrate 200. A protection layer 511 may be formed on a bottom surface of the first substrate 500. For example, the protection layer 511 may include the same material as the first mold layer 400. However, the material of the protection layer 511 is not limited thereto. As the first substrate 500 is used as the redistribution substrate, the first substrate 500 may have a thickness T2 less than that of the printed circuit board (i.e. interconnect substrate 200). For example, the first substrate 500 may have the thickness T2 less than about 0.01 mm, preferably, less than about 0.02 mm. It thus may be possible to reduce a size of semiconductor package.

Outer terminals 550 may be formed on the bottom surface of the first substrate 500 and connected to the conductive pattern 520. The outer terminals 550 may not be aligned with the upper pads 224 in the third direction D3. The number of the outer terminals 550 may be different from that of the upper pads 224. The outer terminals 550 may be electrically connected to the upper pads 224 through the conductive pattern 520, the lower pads 221, the line pattern 222, and the vias 223. The line pattern 222 may be provided in the interconnect substrate 200 such that the upper pads 224 may not be aligned with the lower pads 221 in the third direction D3. The conductive pattern 520 may therefore be less in number and arrangement than the upper pads 224 or lower pads 221. The conductive pattern 520 may therefore be reduced in number and arrangement due to the upper pads 224 or lower pads 221 of the interconnect substrate 200. The thickness T2 of the first substrate 500 may be even more reduced.

The conductive pattern 520 may have a coefficient of thermal expansion (CTE) greater than that of the first semiconductor chip 300. For example, the conductive pattern 520 may have a CTE of about 25 ppm/° C., and the first semiconductor chip 300 may have a CTE of about 3 ppm/° C. A semiconductor package may suffer from warpage caused by a CTE mismatch between the conductive pattern 520 and the first semiconductor chip 300. In some exemplary embodiments, the metal layer ML may have a CTE greater than that of the first semiconductor chip 300 and similar to that of the conductive pattern 520. For example, the metal layer ML may have a CTE in the range from about 25 ppm/° C. to about 50 ppm/° C. The metal layer ML may face the conductive pattern 520 across the first semiconductor chip 300. The CTE mismatch between the first semiconductor chip 300 and the metal layer ML may be balanced with a CTE mismatch between the first semiconductor chip 300 and the metal layer ML. It thus may be possible to prevent a semiconductor package from warpage. In some exemplary embodiments, as the metal layer ML has a higher modulus (e.g., more than about 50 GPa), it may be more advantageous in preventing semiconductor package warpage. In the event that the metal layer ML has a CTE of less than about 25 ppm/° C., a modulus of less than about 50 GPa, or a small thickness less than about 15 μm, the metal layer ML may have difficulty in preventing a semiconductor from warpage. Alternatively, in the event that the metal layer ML has a CTE of more than about 50 ppm/° C. or a large thickness more than about 15 μm, the CTE mismatch between the metal layer ML and the first semiconductor chip 300 may become excessively large. In this case, a semiconductor package may suffer from warpage induced by the CTE mismatch between the metal layer ML and the first semiconductor chip 300.

In some exemplary embodiments, the adhesive layer 350 may be hardened or plastically deformed solidified as discussed in FIG. 2B. The adhesive layer 350 may help in preventing semiconductor package warpage.

The metal layer ML may have a thermal conductivity greater than that of the first semiconductor chip 300. For example, the metal layer ML may have a thermal conductivity of more than about 140 W/mK and, more specifically, range from about 140 W/mK to about 300 W/mK. The metal layer ML may have a coefficient of thermal expansion greater than that of the first semiconductor chip 300. When a semiconductor package is in use, heat generated from the first semiconductor chip 300 may be rapidly exhausted from the package through the metal layer ML. It therefore may be possible to enhance the operational reliability of the semiconductor package by selecting materials having beneficial dimensional and operational characteristics. In the case where the adhesive layer 350 may have a thickness greater than about 5 μm, heat generated from the first semiconductor chip 300 may relatively slowly move to the metal layer ML. In some exemplary embodiments, the adhesive layer 350 may have a thickness T3 in the range from about 0.01 μm to about 5 μm.

Figure 2E:
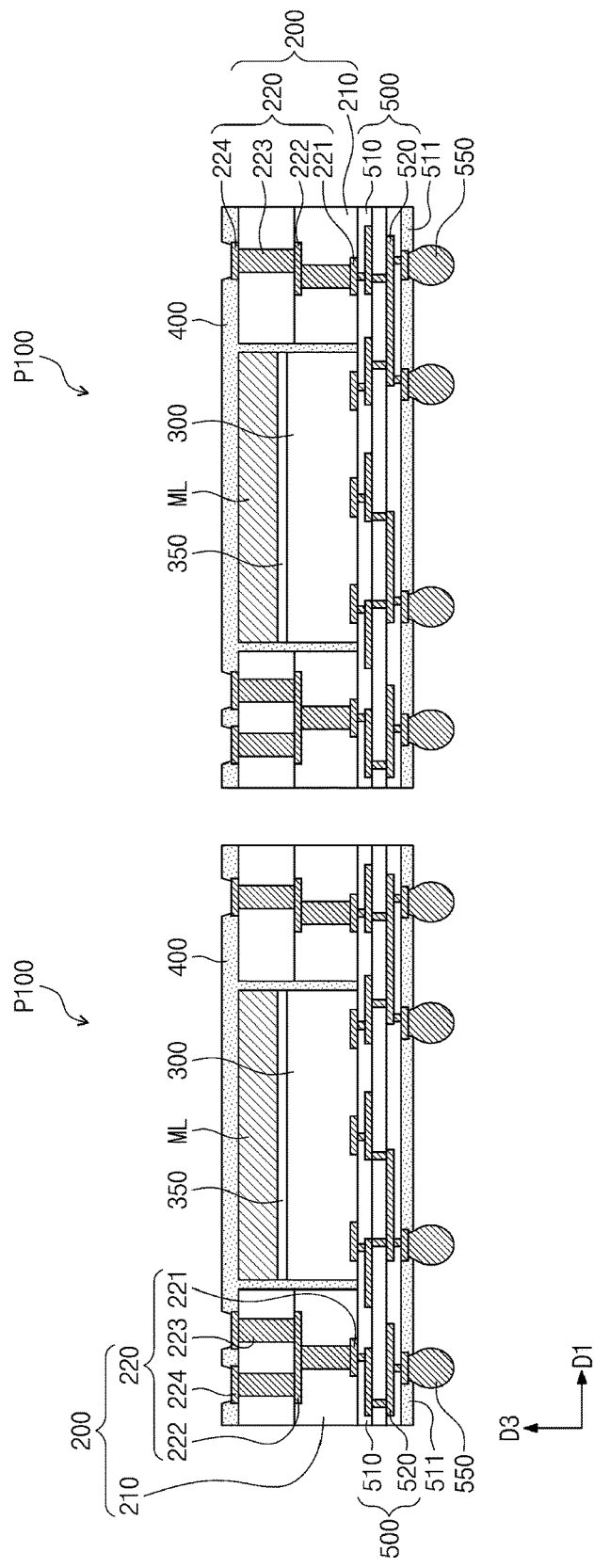

As shown in FIGS. 1A, 1B and 2E, the first substrate 500 and the interconnect substrate 200 may be sawed to form first packages P100. Each of the first packages P100 may be substantially the same as that illustrated in FIG. 1B. The interconnect substrate 200 of the first package P100 may include the hole 290.

Figure 2F:
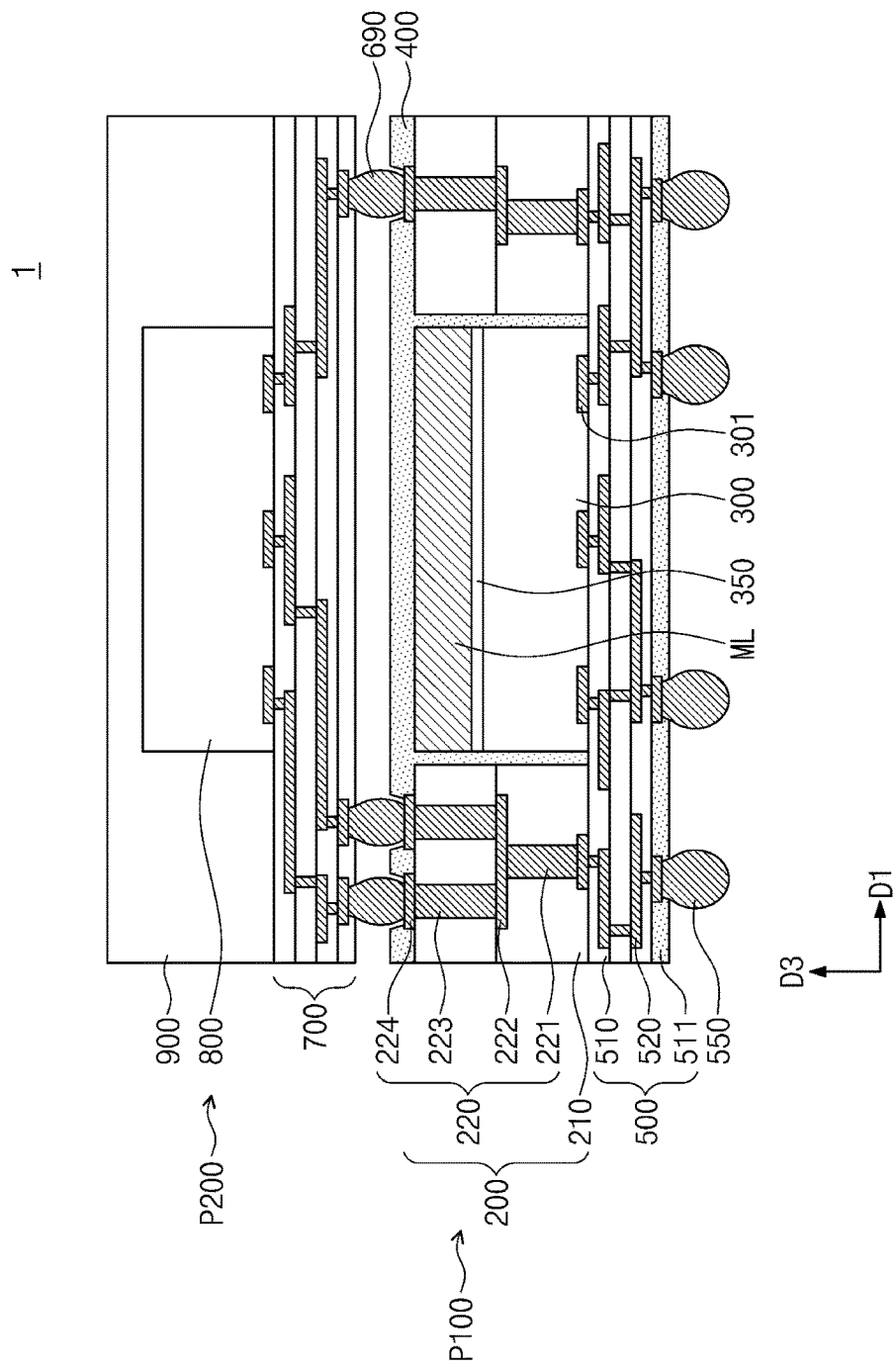

As shown in FIGS. 1B and 2F, a second package P200 may be mounted on the first package P100 of FIG. 2E so that a semiconductor package 1 may be manufactured. The second package P200 may include a second substrate 700, a second semiconductor chip 800, and a second mold layer 900. The second semiconductor chip 800 may be mounted in a flip chip manner on the semiconductor substrate 700. Differently from those shown in the prior figures, the second semiconductor chip 800 may be electrically connected to the second substrate 700 through bonding wires (not shown). The second mold layer 900 may be provided on the second substrate 700 so as to cover the second semiconductor chip 800. Interconnect terminals 690 may be provided on a bottom surface of the second substrate 700. The interconnect terminals 690 may be connected to the upper pads 224 such that the second package P200 may be electrically connected to the first package P100.

Figure 2G:
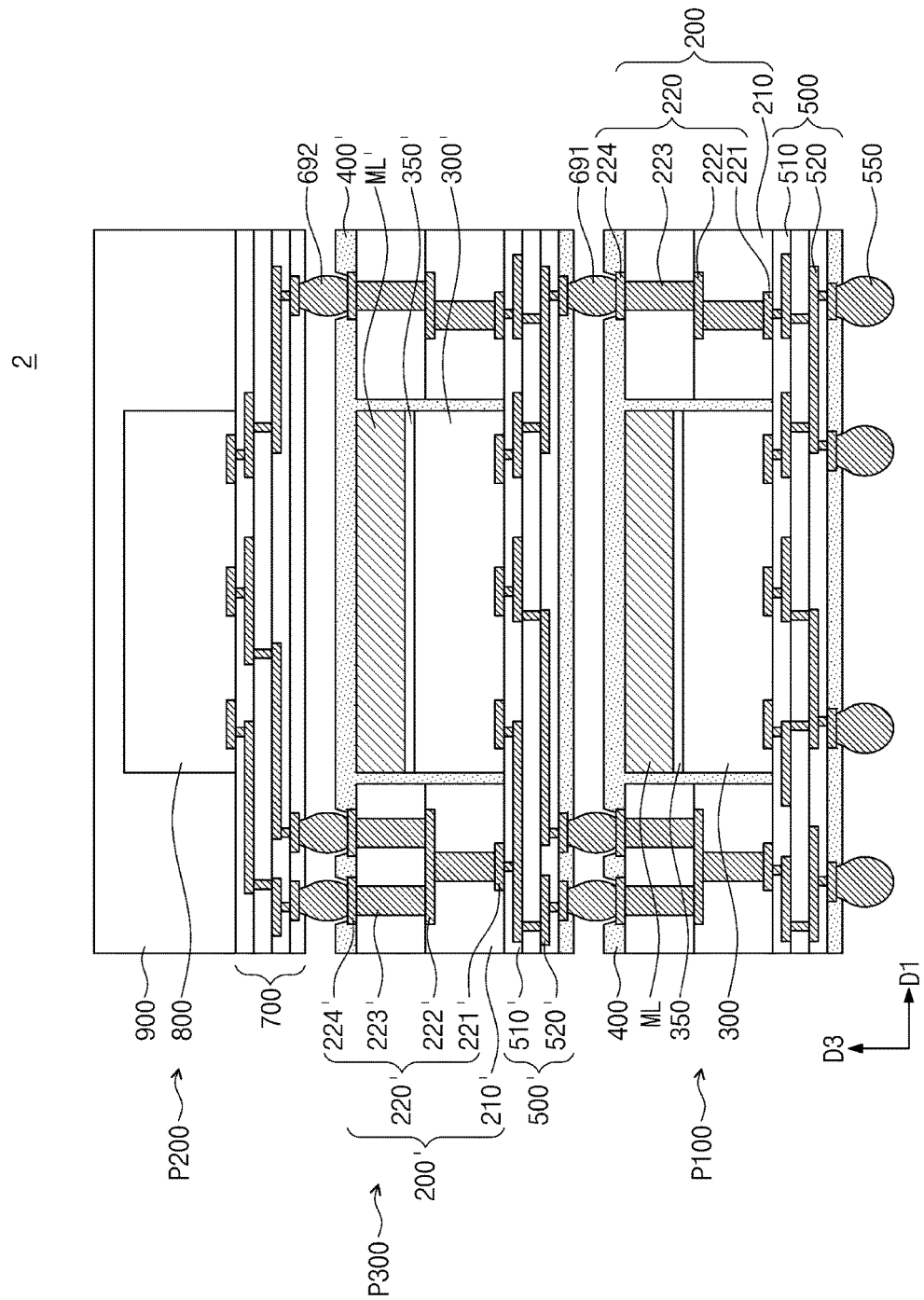
FIG. 2G is a cross-sectional view illustrating a semiconductor package according to exemplary embodiments.

FIG. 2G is a cross-sectional view illustrating a semiconductor package according to exemplary embodiments. A repetitive description of the same or similar components described above may be omitted in the following description.

As shown in FIG. 2G, a semiconductor package 2 may include the first package P100, a third package P300, and the second package P200 that are stacked. The first package P100 may be fabricated by the same method as described in FIGS. 1A to 2E. The third package P300 may be fabricated by the same method as described in fabricating the first package P100 discussed in FIGS. 1A to 2E. For example, a third substrate 500', a third semiconductor chip 300', an upper adhesive layer 350', an upper interconnect substrate 200', a third mold layer 400', and a metal layer ML' may be respectively substantially the same as the first substrate 500, the first semiconductor chip 300, the adhesive layer 350, the interconnect substrate 200, the first mold layer 400, and the metal layer ML. Upper base layers 210' and an upper conductive member 220' may be respectively substantially the same as the base layers 210 and the conductive member 220 of FIG. 2A. First interconnect terminals 691 may be provided between the first package P100 and the third package P300. The first interconnect terminals 691 may be connected to the upper pads 224 and the conductive pattern 520'. A single third package P300 is illustrated provided on the first package P100, but alternatively the third package P300 may be provided in plural.

The second package P200 may be disposed on the third package P300. The second package P200 may include the second substrate 700, the second semiconductor chip 800, and the second mold layer 900. Second interconnect terminals 692 may be provided between the second package P200 and the third package P300. The second package P200 may be electrically connected to the third package P300 through the second interconnect terminals 692.

Figure 4A:
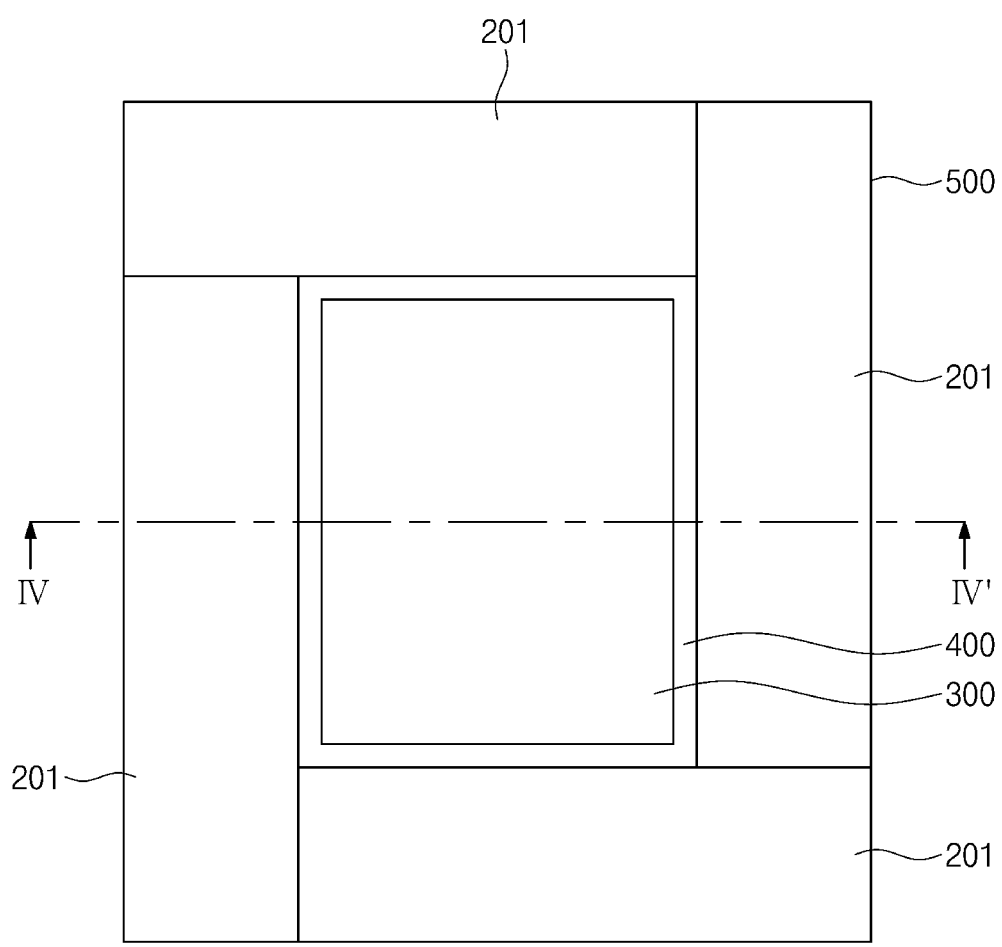
FIG. 4A is a plan view illustrating a first package according to exemplary embodiments.
Figure 4B:
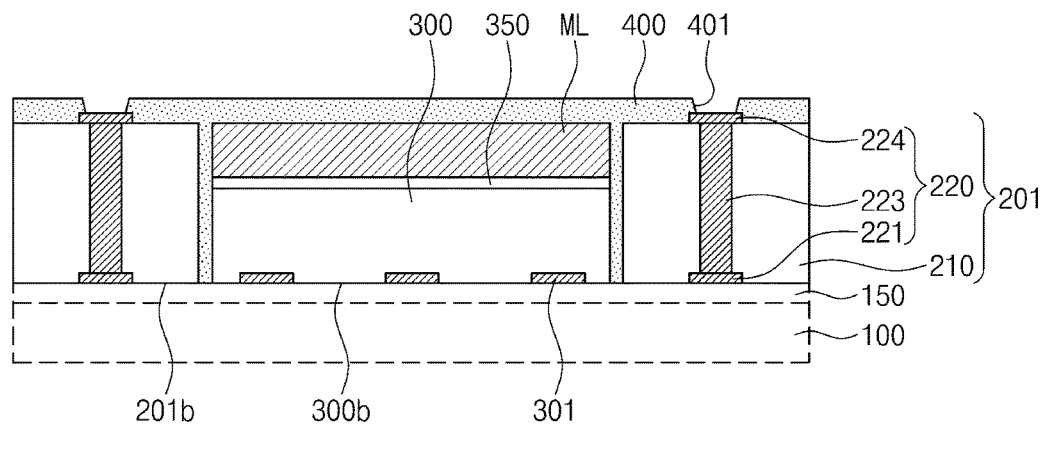
FIGS. 4B and 4C are cross-sectional views, corresponding to cross-sectional views taken along line IV-IV' of FIG. 4A, illustrating a method for fabricating a first package according to exemplary embodiments.
Figure 4C:
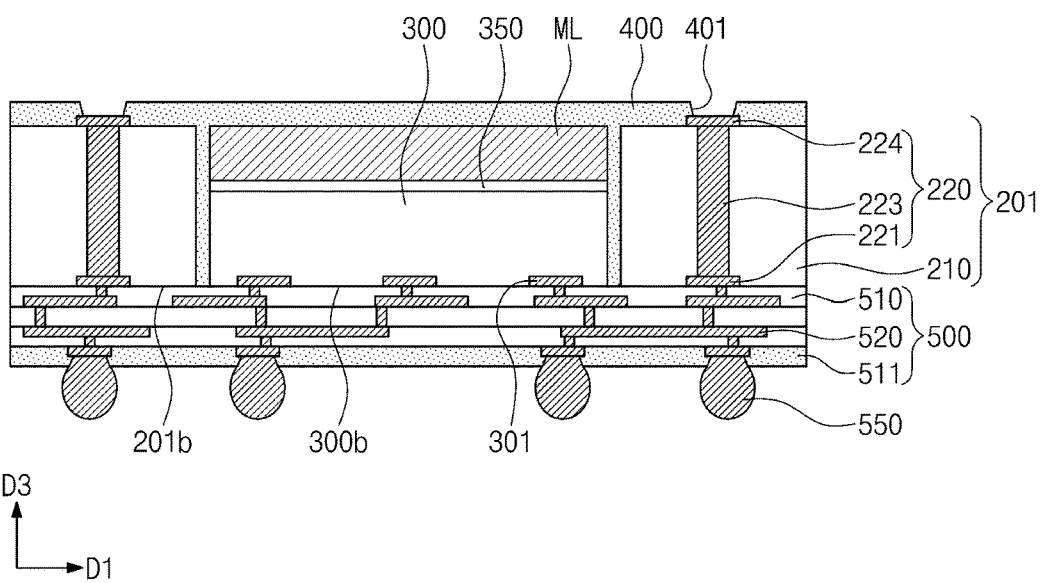

FIG. 4A is a plan view illustrating a first package according to exemplary embodiments. FIGS. 4B and 4C are cross-sectional views, corresponding to cross-sectional views taken along line IV-IV' of FIG. 4A, illustrating a method for fabricating a first package according to exemplary embodiments. For brevity of the description, a method for fabricating a single first package will be hereinafter illustrated and discussed. However, the following exemplary embodiments do not exclude a method for fabricating a wafer-level first package. As in the previously described exemplary embodiments, repetitive description of the same or similar components described above may be omitted in the following description.

As shown in FIGS. 4A and 4B, an interconnect substrate 201 and the first semiconductor chip 300 may be provided on the carrier substrate 100. As shown in FIG. 4A, the interconnect substrate 201 may have a rectangular shape. Multiple interconnect substrates 201 may be provided. The multiple interconnect substrates 201 may be disposed to surround the first semiconductor chip 300, as shown in FIG. 4A. As shown in FIG. 4B, each of the interconnect substrates 201 may include the base layer 210 and the conductive member 220. The conductive member 220 may include the lower pads 221, the vias 223, and the upper pads 224. Differently from the interconnect substrate 200 of FIG. 2A, the line pattern (designated by the reference numeral 222 of FIG. 2A) may be omitted, and the vias 223 may be in direct contact with the lower pads 221 and the upper pads 224. The vias 223 may penetrate the base layer 210. The interconnect substrate 201 may be disposed on the carrier substrate 100 before or after the first semiconductor chip 300 is disposed. The metal layer ML may be adhered to the first semiconductor chip 300 through the adhesive layer 350. The first semiconductor chip 300, the adhesive layer 350, and the metal layer ML may be substantially the same as those discussed in FIGS. 3A to 3D. The first mold layer 400 may be formed in a gap between the first semiconductor chip 300 and the metal layer ML. The carrier substrate 100 and the carrier glue layer 150 may be removed to expose the bottom surface 300b of the first semiconductor chip 300 and bottom surfaces 201b of the interconnect substrates 201.

As shown in FIGS. 4A and 4C, the first substrate 500 may be formed on the bottom surface 300b of the first semiconductor chip 300 and the bottom surfaces 201b of the interconnect substrate 201, thereby fabricating a first package P101. The first substrate 500 may include the insulative patterns 510 and the conductive pattern 520. The outer terminals 550 may be formed on the bottom surface of the first substrate 500 and connected to the conductive pattern 520. Those similar or same components discussed above and shown in FIG. 2D may be applicable to formation methods and electrical connections of the first substrate 500 and the outer terminals 550 shown here in FIG. 4C.

Figure 5A:
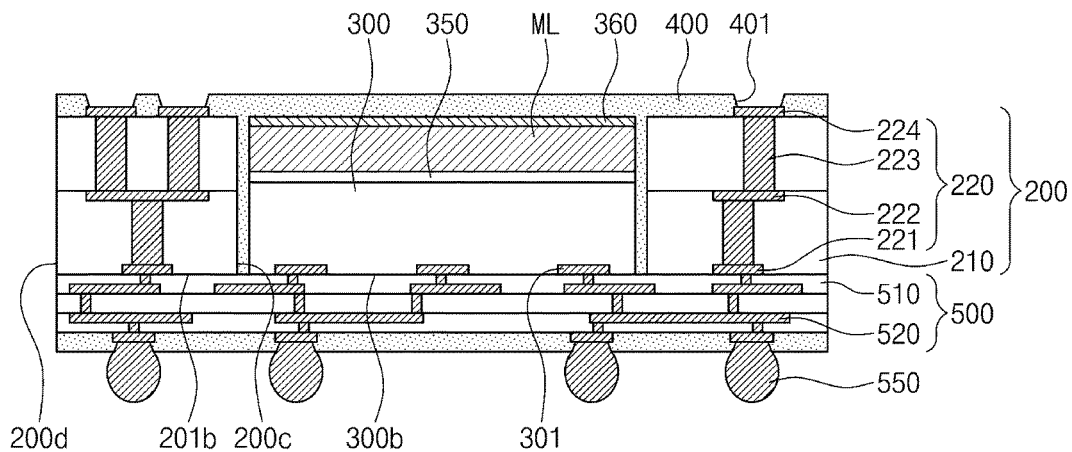
FIG. 5A is a cross-sectional view illustrating a first package according to exemplary embodiments.

FIG. 5A is a cross-sectional view illustrating a first package according to exemplary embodiments. A repetitive description of the same or similar components described above may be omitted in the following description.

As shown in FIG. 5A, a first package P102 may include the first substrate 500, the first semiconductor chip 300, the interconnect substrate 200, the adhesive layer 350, and the first mold layer 400. Those similar or same components discussed above and shown in FIGS. 1A to 2E may be substantially identically applicable to form the first substrate 500, the first semiconductor chip 300, and the interconnect substrate 200 shown in FIG. 5A. An upper carbon layer 360 may be provided on a top surface of the metal layer ML. The upper carbon layer 360 may include carbon nanotube, graphene, or graphite. For example, the upper carbon layer 360 may be directly grown on the top surface of the metal layer ML, and the metal layer ML may be disposed on the first semiconductor chip 300. In this case, the upper carbon layer 360 may have a width and a planar shape substantially the same as those of the metal layer ML. Alternatively, the upper carbon layer 360 may be grown in advance on a mother board (not shown) and then provided on the metal layer ML. The upper carbon layer 360 may have a thermal conductivity greater than that of the first semiconductor chip 300. Therefore, when the first package P102 is operated, heat generated from the first semiconductor chip 300 may be rapidly exhausted through the metal layer ML and the upper carbon layer 360. A lower carbon layer (not shown) may be further interposed between the first semiconductor chip 300 and the adhesive layer 350.

The first mold layer 400 may cover the top surface of the interconnect substrate 200 and a top surface of the upper carbon layer 360. The first mold layer 400 may have openings 401 which expose the upper pads 224 that, as shown in FIGS. 2D and 5A, may be even with or extend above the top surface of the metal layer ML. Alternatively, the first mold layer 400 may have no openings 401. The first mold layer 400 may extend into a gap between the first semiconductor chip 300 and an inner surface 200c of the interconnect substrate 200. The first mold layer 400 may not cover an outer surface 200d of the interconnect substrate 200. The outer surface 200d of the interconnect substrate 200 may face the inner surface 200c of the interconnect substrate 200.

Figure 5B:
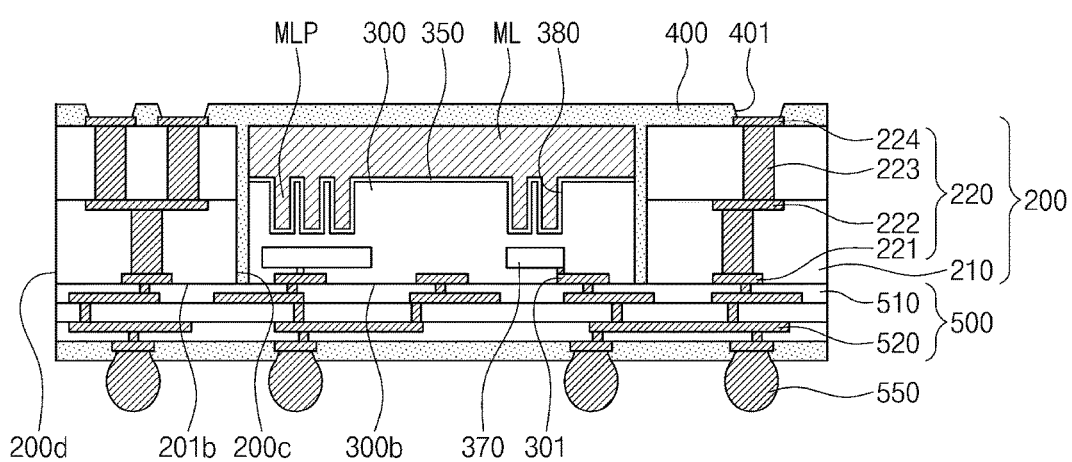
FIG. 5B is a cross-sectional view illustrating a first package according to exemplary embodiments.

FIG. 5B is a cross-sectional view illustrating a first package according to exemplary embodiments. A repetitive description of the same or similar components described above may be omitted from the description that follows below.

As shown in FIG. 5B, a first package P103 may include the first substrate 500, the first semiconductor chip 300, the interconnect substrate 200, the adhesive layer 350, and the first mold layer 400. The first semiconductor chip 300 may include heat sources (not shown) inside thereof. The heat sources may be an IP block such as a central processing unit (CPU), a memory interface, a universal serial bus (USB), etc. The IP block may mean a block configured as either hardware or software and having a function necessary for constituting a semiconductor integrated circuit. A hot spot 370 may be defined from one of the heat sources that generates heat over a specific amount of heat when the first semiconductor chip 300 is operated.

A recess 380 may be provided on the top surface of the first semiconductor chip 300. The metal layer ML may include protrusions MLP extending into the recess 380. For example, the recess 380, the metal layer ML, and the protrusions MLP may be formed on the wafer-level first semiconductor chip 300 of FIGS. 3A and 3B. The first package P103 may be fabricated using the first semiconductor chip 300 on which the metal layer ML is provided. The protrusions MLP may be disposed adjacent to the hot spot 370. For example, the protrusions MLP may be aligned with the hot spot 370 in the third direction D3. A cross-sectional shape and the number of the protrusion MLP may be variously changed without being limited to those illustrated in the figures herein. As the metal layer ML has the protrusions MLP, a small distance may be accomplished between the metal layer ML and the hot spot 370. When the first semiconductor chip 300 is operated, heat generated from the hot spot 370 may be rapidly transmitted to the metal layer ML through the protrusions MLP. The protrusions MLP may, therefore, be advantageous in enhancing the operational reliability of the first semiconductor chip 300. The adhesive layer 350 may be interposed between the metal layer ML and the first semiconductor chip 300 and between the protrusions MLP and the first semiconductor chip 300. Alternatively, the adhesive layer 350 may be omitted.

Figure 5C:
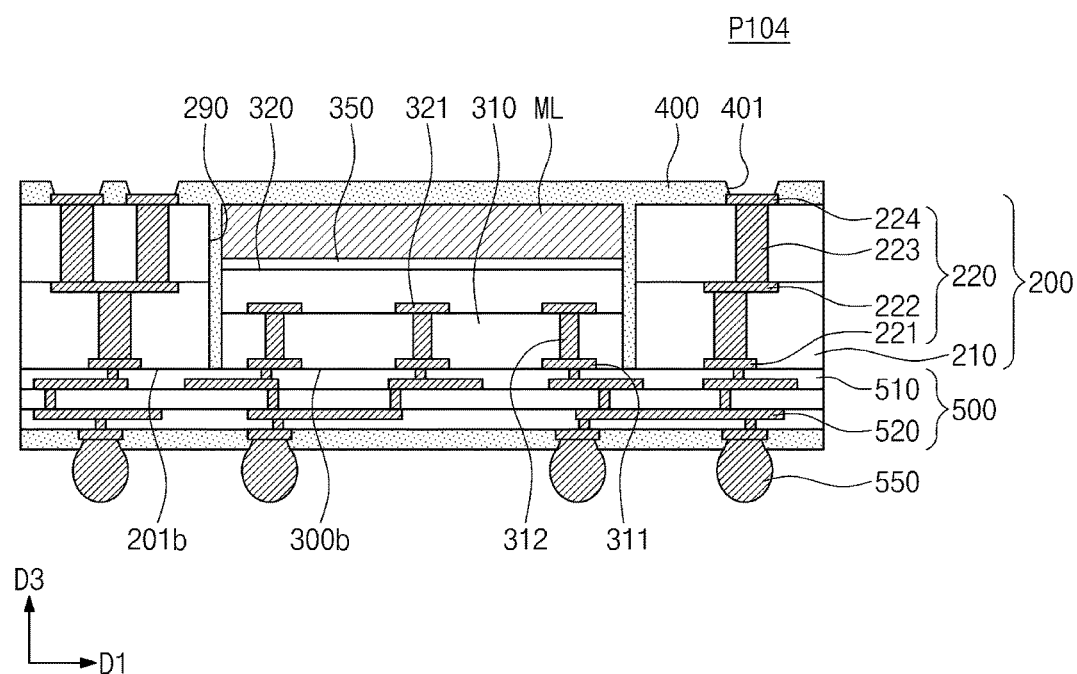
FIG. 5C is a cross-sectional view illustrating a first package according to exemplary embodiments.

FIG. 5C is a cross-sectional view illustrating a first package according to exemplary embodiments. A repetitive description of the same or similar components described above may be omitted from the description that follows.

As shown in FIG. 5C, a first package P104 may include the first substrate 500, a first lower semiconductor chip 310, a first upper semiconductor chip 320, the interconnect substrate 200, the first mold layer 400, the adhesive layer 350, and the metal layer ML.

The first lower and upper semiconductor chips 310 and 320 may include a material substantially the same as that of the first semiconductor chip 300 previously described. The first lower and upper semiconductor chips 310 and 320 may be disposed in the hole 290 of the interconnect substrate 200 on the first substrate 500. A first lower chip pad 311 may be disposed on a bottom surface of the first lower semiconductor chip 310 and connected to the conductive pattern 520. The first lower semiconductor chip 310 may include a through via 312 that penetrates thereinside and is connected to the first lower chip pad 311. The first upper semiconductor chip 320 may be stacked on the first lower semiconductor chip 310. The first upper semiconductor chip 320 may include a first upper chip pad 321 on a bottom surface thereof. The first upper chip pad 321 may be connected to the through via 312 such that the first upper semiconductor chip 320 may be electrically connected to the first substrate 500.

The metal layer ML may be disposed on the first upper semiconductor chip 320. The metal layer ML may have a thermal conductivity and a CTE that are greater than those of the first semiconductor chips 310 and 320. The metal layer ML may reduce or prevent warpage of the first package P104.

Figure 5D:
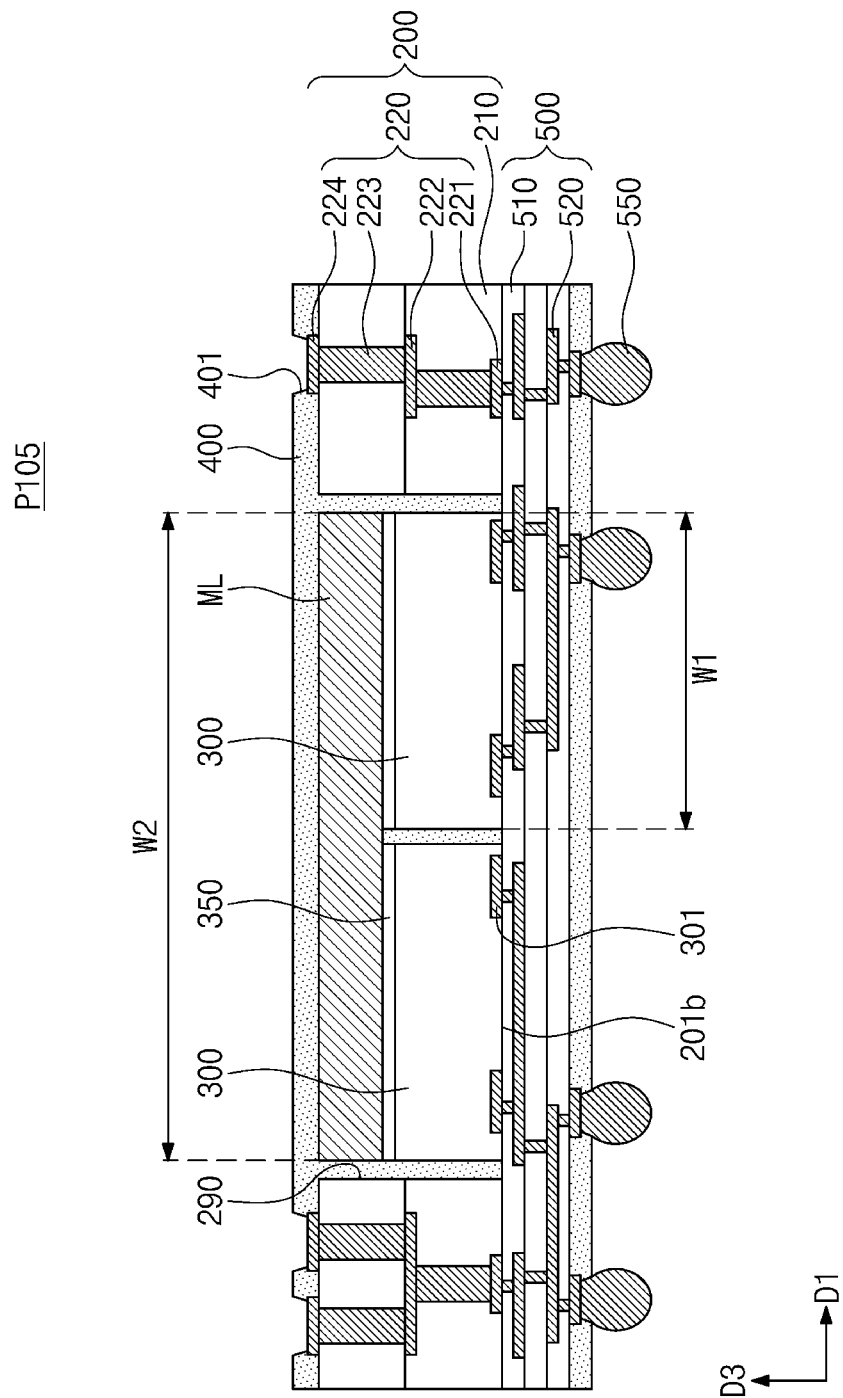
FIGS. 5D and 5E are cross-sectional views respectively illustrating a first package according to exemplary embodiments.
Figure 5E:
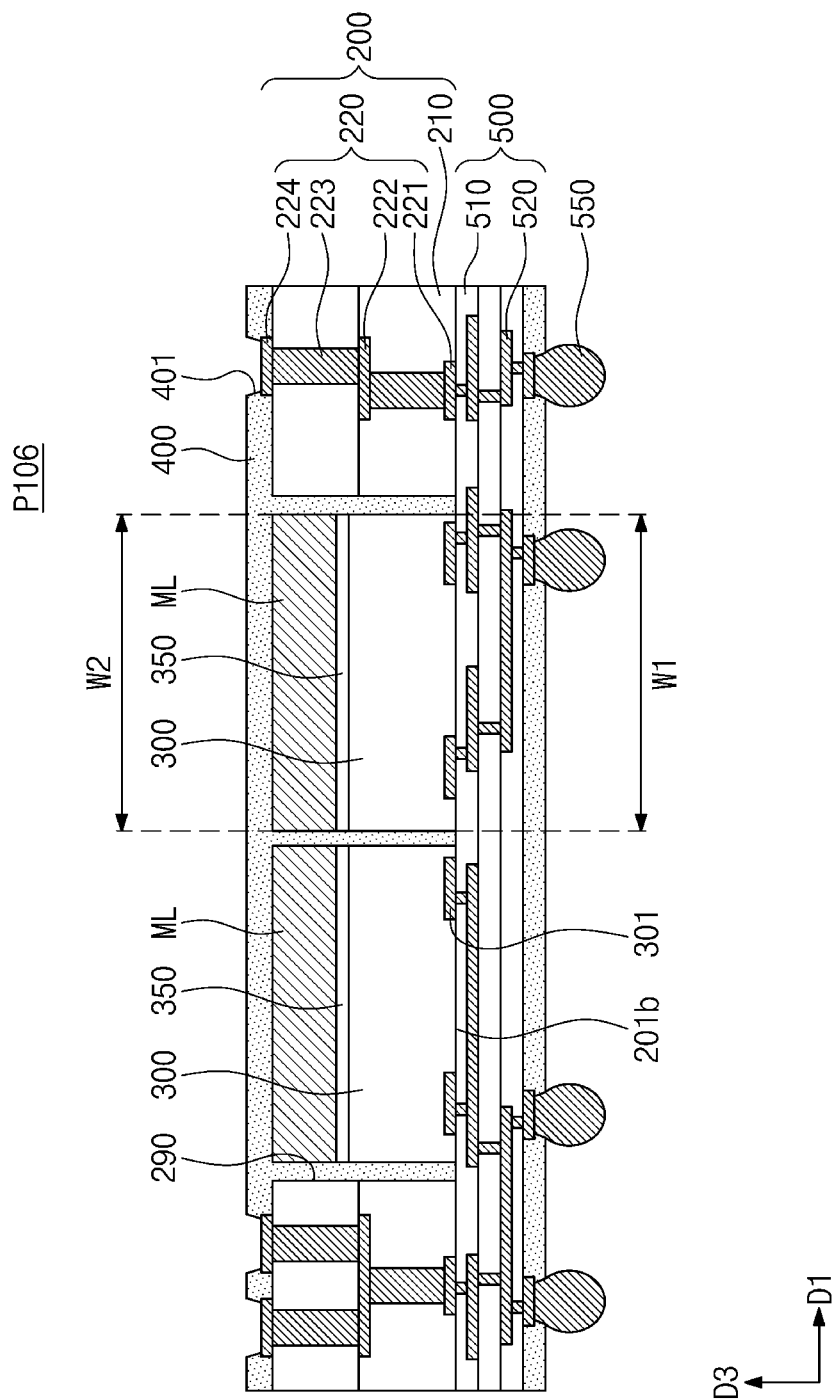

FIGS. 5D and 5E are cross-sectional views respectively illustrating a first package according to exemplary embodiments.

As shown in FIGS. 5D and 5E, each of first packages P105 and P106 may include the first substrate 500, the first semiconductor chip 300, the interconnect substrate 200, the first mold layer 400, the adhesive layer 350, and the metal layer ML. Those components described above and shown in FIGS. 1A to 2E may be substantially identically applicable to the first substrate 500, the first mold layer 400, the adhesive layer 350, the interconnect substrate 200, and the metal layer ML in the description that follows. Multiple first semiconductor chips 300 may be provided in the hole 290 of the interconnect substrate 200. The first semiconductor chips 300 may be spaced apart from each other in the first direction D1.

As shown in FIG. 5D, the metal layer ML may be provided as a single contiguous formation and cover the first semiconductor chips 300. The width W2 of the metal layer ML may be substantially the same as or greater than a sum of the widths W1 of the first semiconductor chips 300.

As shown in FIG. 5E, the metal layer ML may be provided in plural formations. The metal layers ML may be respectively provided on the first semiconductor chips 300. Each of the metal layer ML may have the width W2 substantially the same as the width W1 of its corresponding one of the first semiconductor chips 300.

Figure 6A:
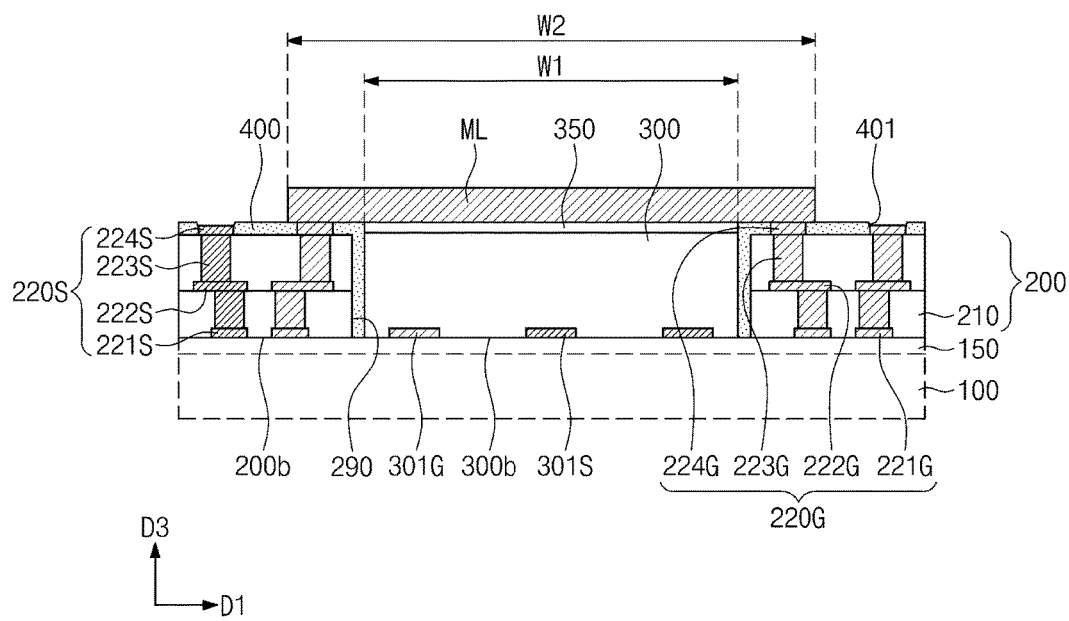
FIGS. 6A to 6C are cross-sectional views illustrating a method for manufacturing a semiconductor package according to exemplary embodiments.
Figure 6B:
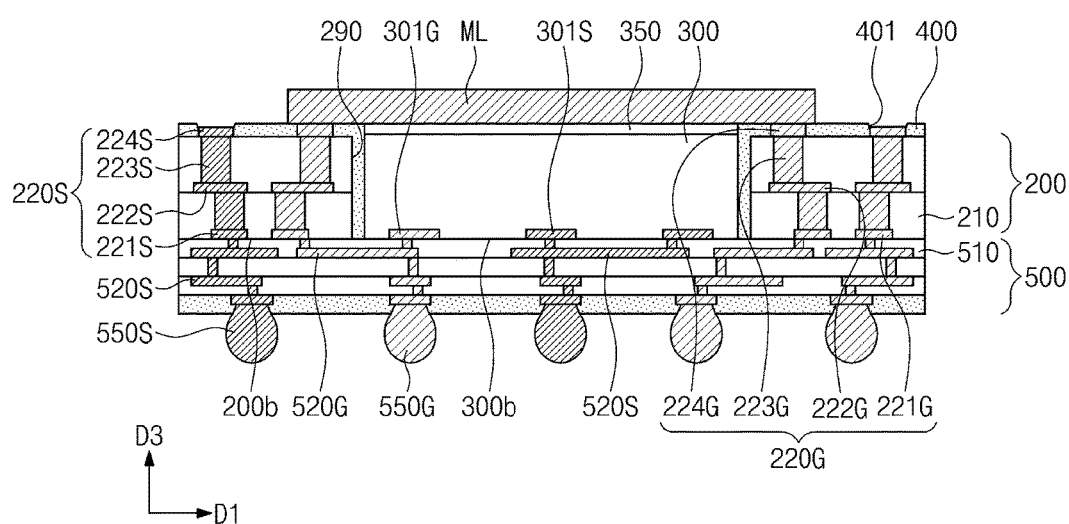
Figure 6C:
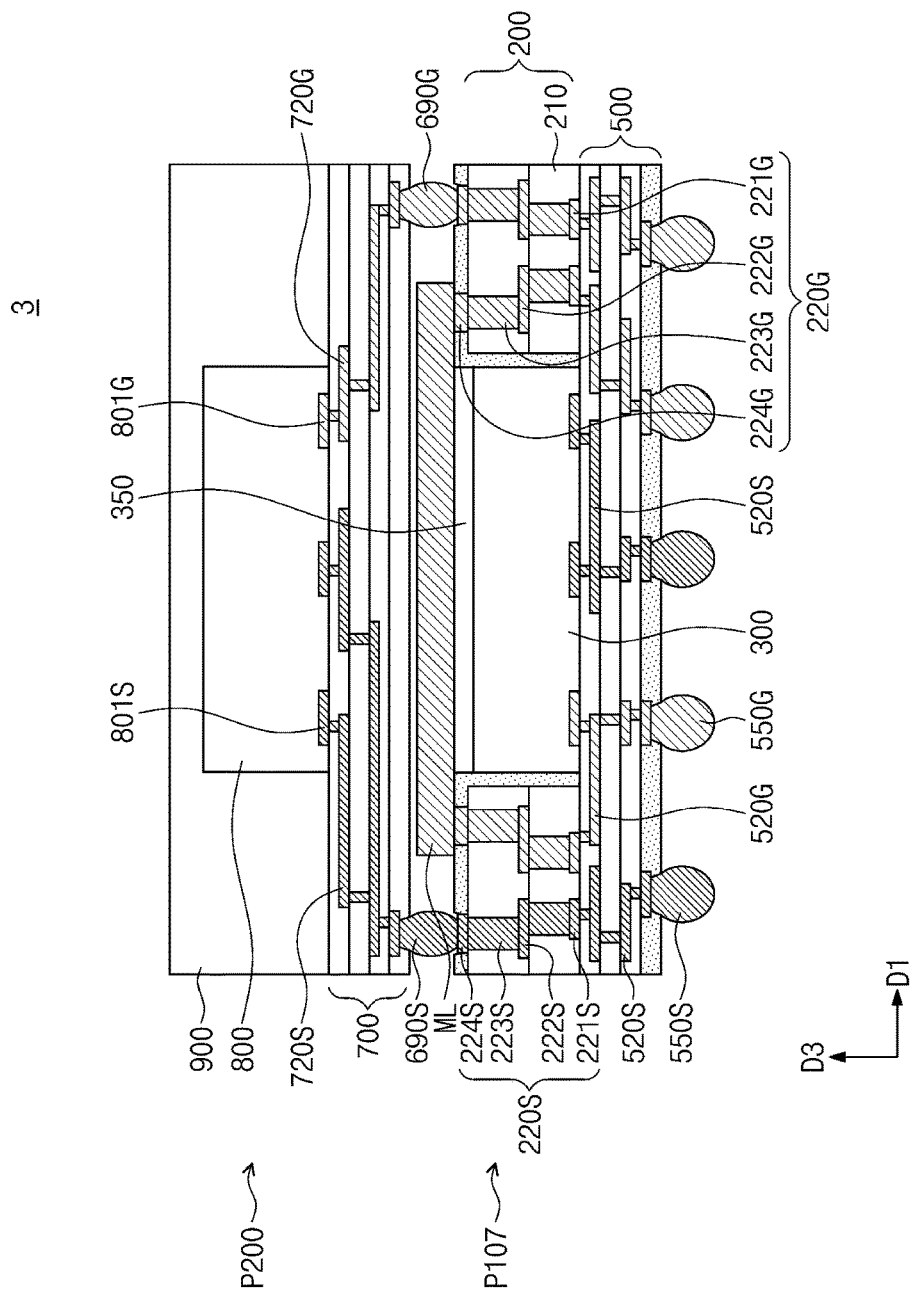

FIGS. 6A to 6C are cross-sectional views illustrating a method for manufacturing a semiconductor package according to exemplary embodiments. A repetitive description of the same or similar components described above may be omitted from the description that follows.

As shown in FIG. 6A, the first semiconductor chip 300, the interconnect substrate 200, the first mold layer 400, and the metal layer ML may be disposed on the carrier substrate 100. The conductive member 220 may include a ground pattern 220G and a signal pattern 220S. The ground pattern 220G may include lower ground pads 221G, a ground line pattern 222G, ground vias 223G, and upper ground pads 224G. The signal pattern 220S may include a lower signal pad 221S, a signal line pattern 222S, signal vias 223S, and an upper signal pad 224S. The signal pattern 220S may be insulated from the ground pattern 220G. The lower pads 221G and 221S may be provided on the bottom surface 200b of the interconnect substrate 200, and the upper pads 224G and 224S may be provided on the top surface of the interconnect substrate 200. The line patterns 222G and 222S may be interposed between the base layers 210. The vias 223G and 223S may penetrate at least one of the base layers 210.

The first semiconductor chip 300 may include a first ground chip pad 301G and a first signal chip pad 301S. The first ground chip pad 301G may be insulated from the first signal chip pad 301S. The first mold layer 400 may be provided on the top surface of the interconnect substrate 200 and a side surface of the first semiconductor chip 300 and may not cover the top surface of the first semiconductor chip 300 and top surfaces of the upper pads 224G and 224S.

The metal layer ML may be provided on the top surface of the first semiconductor chip 300. The metal layer ML may have a thickness and a modulus that are identical to those as discussed in FIG. 2B and have a CTE and a thermal conductivity discussed in FIG. 2D. The width W2 of the metal layer ML may be greater than the width W1 of the first semiconductor chip 300. The metal layer ML may extend onto and be connected to one of the upper ground pads 224G. The metal layer ML may not cover another one of the upper ground pads 224G. The metal layer ML may be spaced apart from the upper signal pad 224S in the first direction D1 and insulated from the upper signal pad 224S. Thereafter, the carrier substrate 100 and the carrier glue layer 150 may be removed.

As shown in FIG. 6B, the first substrate 500 may be formed on the bottom surfaces of the first semiconductor chip 300 and the interconnect substrate 200, thereby fabricating a first package P107. The first substrate 500 may include the insulative patterns 510, a ground conductive pattern 520G, and a signal conductive pattern 520S. The conductive patterns 520G and 520S may be formed by the same method as described in fabricating the conductive pattern 520 of FIG. 2D. The ground conductive pattern 520G may be connected to the first ground chip pad 301G and the lower ground pads 221G. The signal conductive pattern 520S may be connected to the first signal chip pad 301S and the lower signal pad 221S. The signal conductive pattern 520S may be insulated from the ground conductive pattern 520G.

Outer terminals 550G and 550S depict, respectively, outer ground terminals and outer signal terminals and may be formed on the bottom surface of the first substrate 500. The outer terminals 550 described above and shown in FIG. 2D may be substantially identically applicable to formation and arrangement of the outer terminals 550G and 550S. The ground terminals 550G and the signal terminals 550S may be respectively connected to the ground conductive pattern 520G and the signal conductive pattern 520S. The metal layer ML may be grounded through the ground pattern 220G, the ground conductive pattern 520G, and the ground terminal 550G. Alternatively, after the first substrate 500 is formed, the metal layer ML may be disposed on the first semiconductor chip 300.

As shown in FIG. 6C, the second package P200 may be prepared to include the second substrate 700, the second semiconductor chip 800, and the second mold layer 900. The second semiconductor chip 800 may include a second ground chip pad 801G and a second signal chip pad 801S. The second substrate 700 may include an upper ground pattern 720G and an upper signal pattern 720S. The upper ground pattern 720G and the upper signal pattern 720S may be respectively connected to the second ground chip pad 801G and the second signal chip pad 801S. A ground interconnect terminal 690G and a signal interconnect terminal 690S may be provided on the bottom surface of second substrate 700, and respectively connected to the upper ground pattern 720G and the upper signal pattern 720S.

The second package P200 may be disposed on the first package P107 of FIG. 6B. Here, the signal interconnect terminal 690S may be aligned with the upper signal pad 224S of the first package P107. The ground interconnect terminal 690G may be aligned with one of the upper ground pads 224G that is exposed through the metal layer ML. A soldering may be performed to connect the signal interconnect terminal 690S to the upper signal pad 224S. The ground interconnect terminal 690G may be connected to one of the upper ground pads 224G that is exposed through the metal layer ML. A semiconductor package 3 may be fabricated through the aforementioned processes.

FIGS. 7A to 7D are cross-sectional views illustrating a method for manufacturing a semiconductor package according to exemplary embodiments. A repetitive description of the same or similar components described above may be omitted in the following description.

Figure 7A:
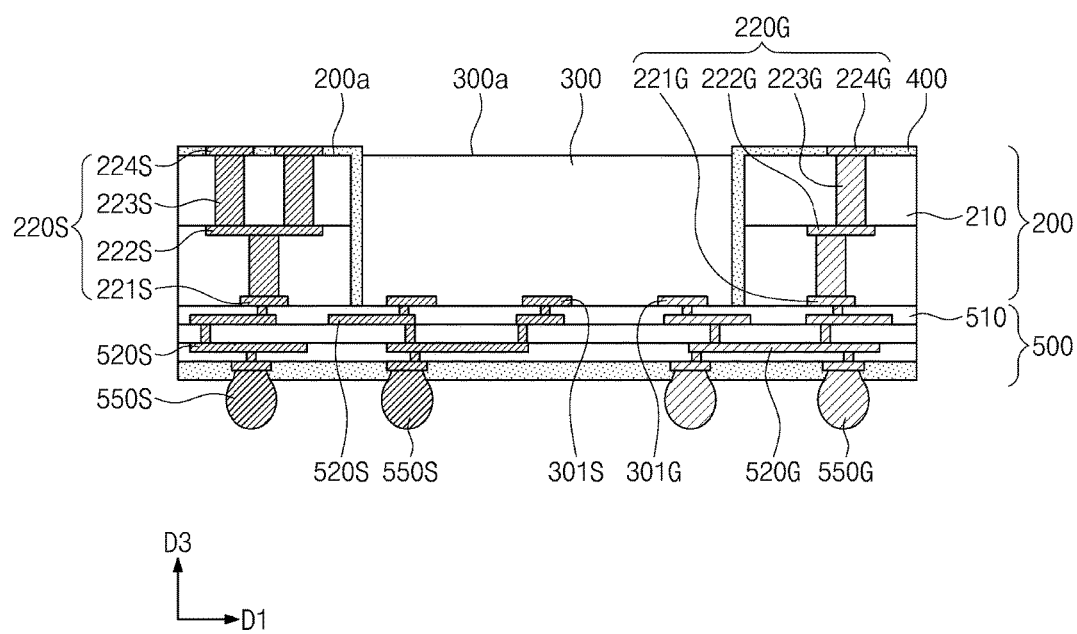
FIGS. 7A to 7D are cross-sectional views illustrating a method for manufacturing a semiconductor package according to exemplary embodiments.

As shown in FIG. 7A, the first substrate 500, the first semiconductor chip 300, the interconnect substrate 200, and the first mold layer 400 may be provided. Components described above and shown in FIGS. 1A to 2E may be substantially identically applicable in formation to the first substrate 500, the first semiconductor chip 300, the interconnect substrate 200, and the first mold layer 400 described here. On the other hand, a top surface 300a of the first semiconductor chip 300 may be positioned at a level substantially the same as that of a top surface 200a of the interconnect substrate 200. The conductive member 220 may include the ground pattern 220G and the signal pattern 220S. An electrical connection between the conductive member 220 and the first substrate 500 may be substantially the same as that discussed in FIG. 6A. For brevity of the description, a plurality of upper signal pads 224S and a single upper ground pad 224G will be hereinafter discussed, but the numbers of the upper signal pads 224S and the upper ground pad 224G are not limited thereto.

Figure 7B:
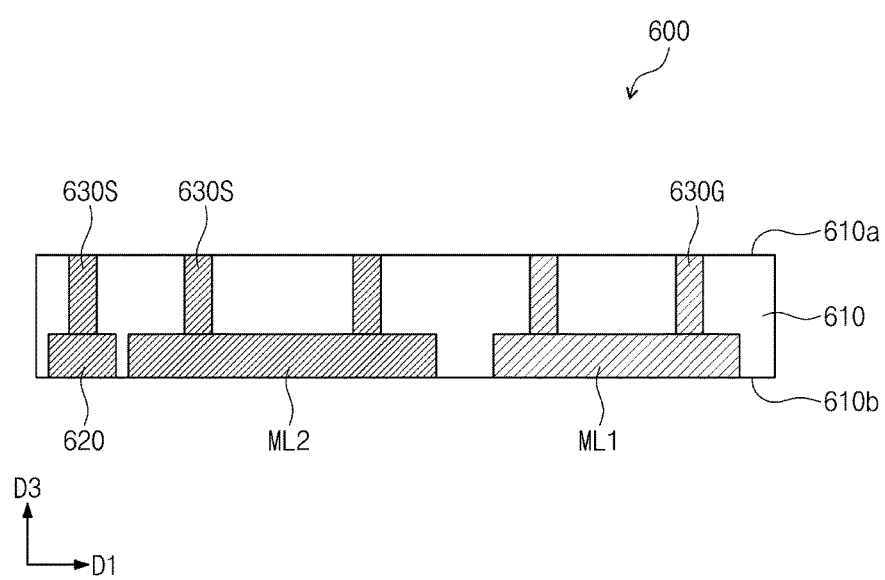

As shown in FIG. 7B, an interposer layer 600 may be prepared to include an insulation layer 610, metal layers ML1 and ML2, a metal pattern 620, and metal vias 630G and 630S. The insulation layer 610 may include a polymer. For example, a flexible film may be used as the insulation layer 610. The insulation layer 610 may have a first surface 610a and a second surface 620a facing each other. The metal layers ML1 and ML2 may be provided in the interposer layer 600. The metal layers ML1 and ML2 may be disposed on the second surface 610b of the insulation layer 610. A first metal layer ML1 may be spaced apart from a second metal layer ML2 in the first direction D1, and the first and second metal layers ML1 and ML2 may be insulated from each other. The first and second metal layers ML1 and ML2 may have a thickness, a modulus, a CTE, and a thermal conductivity that are substantially the same as those of the metal layer ML previously described. The metal pattern 620 may be provided on the second surface 610b of the insulation layer 610. The metal pattern 620 may be spaced apart from the metal layers ML1 and ML2 in the first direction D1 and insulated from the metal layers ML1 and ML2. For example, the metal pattern 620 may be formed by the same method as the metal layers ML1 and ML2. The metal pattern 620 may thus include substantially the same material and thickness as the metal layers ML1 and ML2.

The metal vias 630G and 630S may be provided in the insulation layer 610. The metal vias 630G and 630S may have top surfaces that are exposed through the insulation layer 610. A metal ground via 630G may be provided on and connected to the first metal layer ML1. A metal signal via 630S may be provided in plural. The metal signal vias 630S may be respectively provided on and connected to the second metal layer ML2 and the metal pattern 620.

Figure 7C:
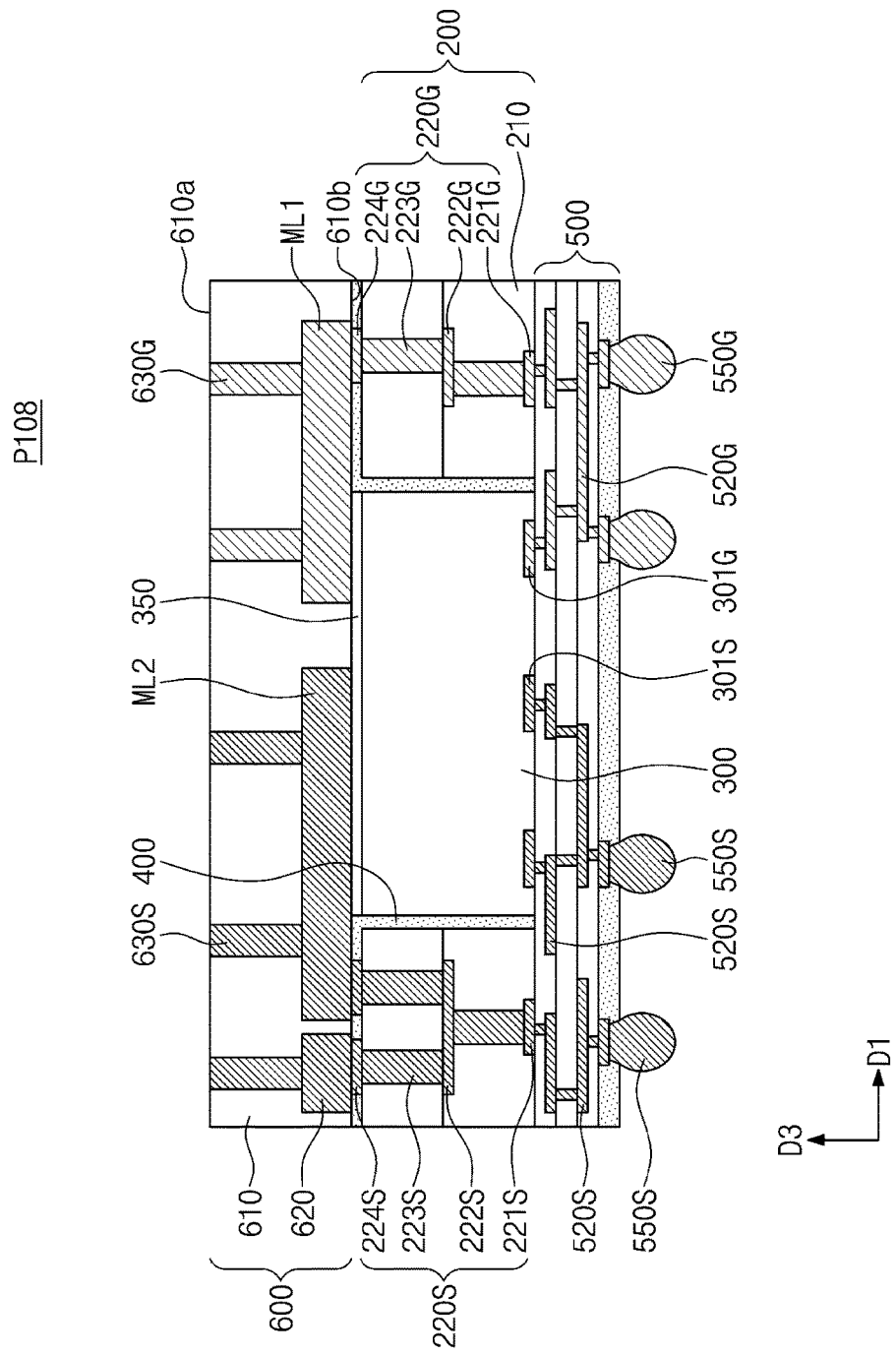

As shown in FIG. 7C, the interposer layer 600 of FIG. 7B may be disposed on the interconnect substrate 200 and the first semiconductor chip 300 of FIG. 7A. In this arrangement, the second surface 610b of the insulation layer 610 may face toward the top surface of the first semiconductor chip 300. The first and second metal layers ML1 and ML2 may cover the first semiconductor chip 300. The first metal layer ML1 may extend onto and be connected to the upper ground pad 224G. The second metal layer ML2 may extend onto and be connected to one of the upper signal pads 224S on the first semiconductor chip 300. The metal pattern 620 may be connected to another one of the upper signal pads 224G. The adhesive layer 350 may be interposed between the first semiconductor chip 300 and the metal layers ML1 and ML2. A first package P108 may thus be fabricated.

Figure 7D:
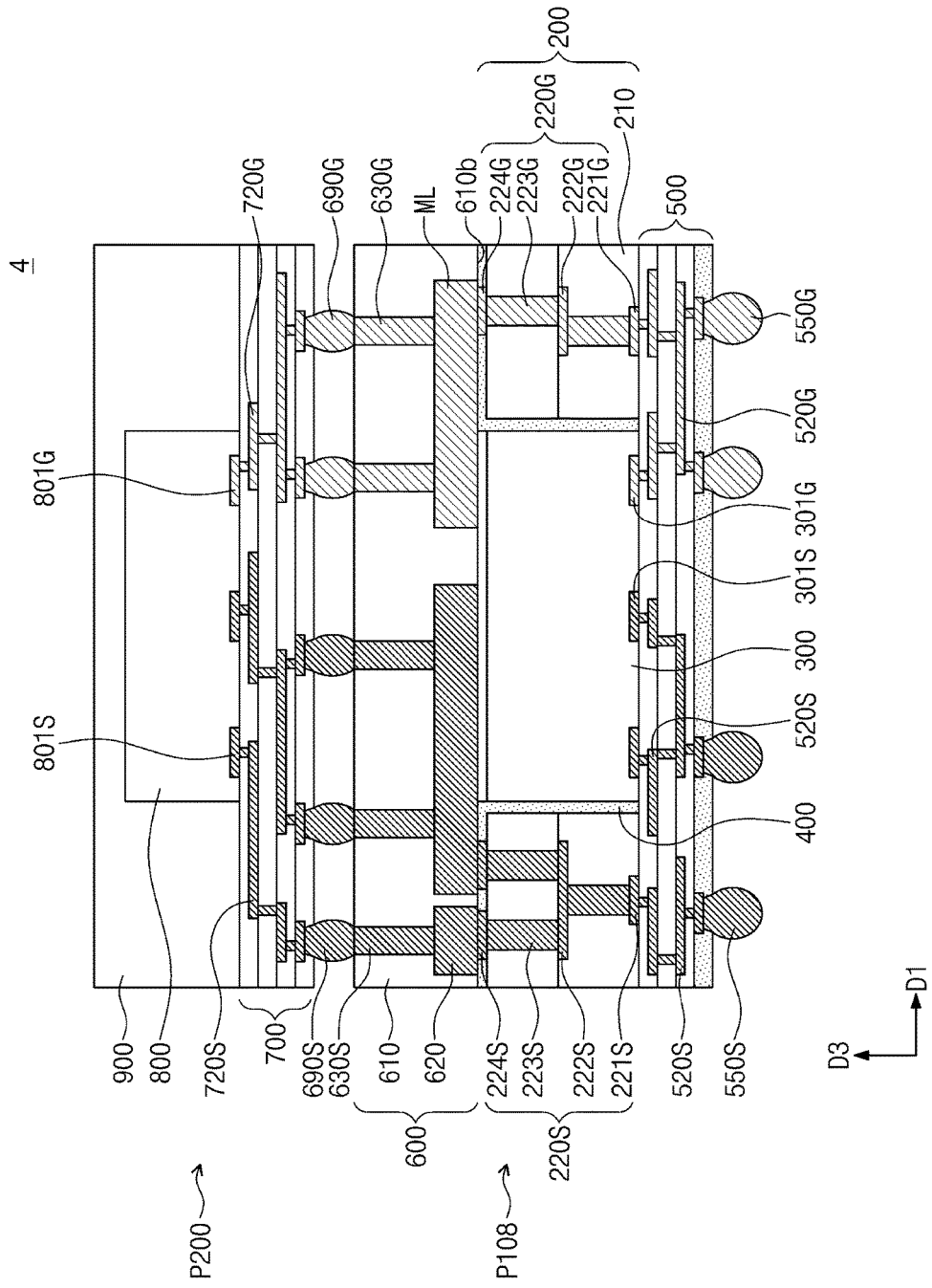

As shown in FIG. 7D, the second package P200 may be mounted on the first package P108 of FIG. 7C so that a semiconductor package 4 may be manufactured. The second semiconductor chip 800 may be electrically connected to the second substrate 700 as discussed in FIG. 6C. The second ground chip pad 801G and the second signal chip pad 801S may be respectively connected to the upper ground pattern 720G and the upper signal pattern 720S. The ground interconnect terminal 690G and the signal interconnect terminal 690S may be provided on the bottom surface of the second substrate 700. There may be provided a plurality of ground interconnect terminals 690G and a plurality of signal interconnect terminals 690S. The ground interconnect terminal 690G and the signal interconnect terminals 690S may be respectively connected to the metal ground via 630G and the metal signal vias 630S. An electrical signal generated from or transmitted to the second semiconductor chip 800 may be transferred to the signal pattern 220S through the metal pattern 620 or the second metal layer ML2. The interconnect terminals 690G and 690S may be different from the upper pads 224G and 224S in terms of number, pitch, or arrangement. The interposer layer 600 may be provided so that the number of possible arrangements of the second conductive patterns 720G and 720S may be increased.

FIGS. 8A to 8D are cross-sectional views illustrating a method for manufacturing a semiconductor package according to exemplary embodiments. A repetitive description of the same or similar components above may be omitted from the following description.

Figure 8A:
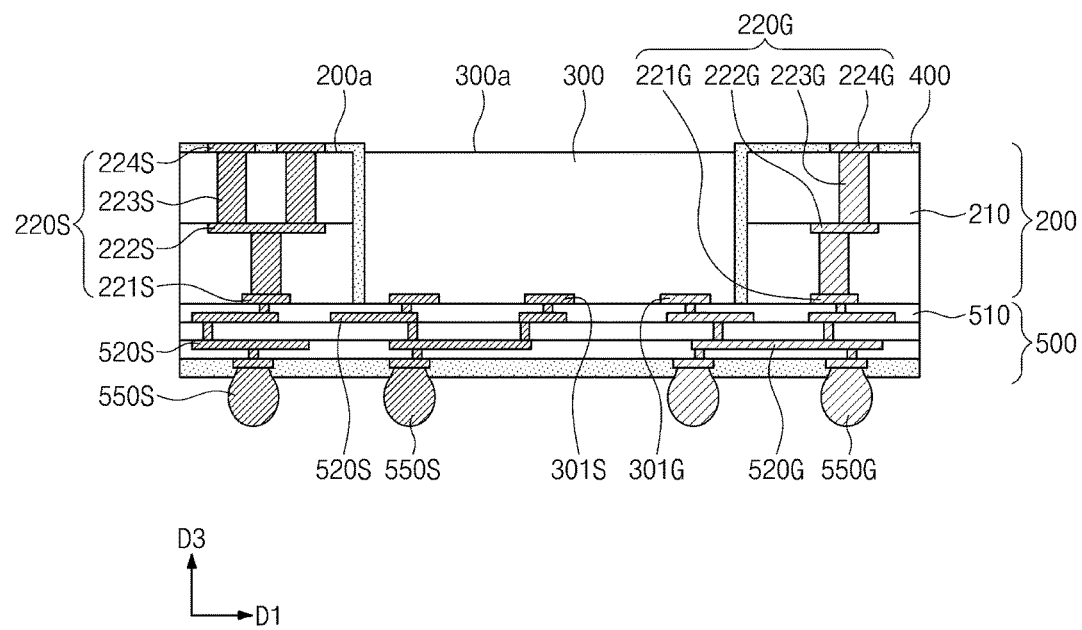
FIGS. 8A to 8D are cross-sectional views illustrating a method for manufacturing a semiconductor package according to exemplary embodiments.

As shown in FIG. 8A, the first substrate 500, the first semiconductor chip 300, the interconnect substrate 200, and the first mold layer 400 may be provided. The first substrate 500, the first semiconductor chip 300, the interconnect substrate 200, and the first mold layer 400 may be substantially the same as those discussed in FIG. 7A.

Figure 8B:
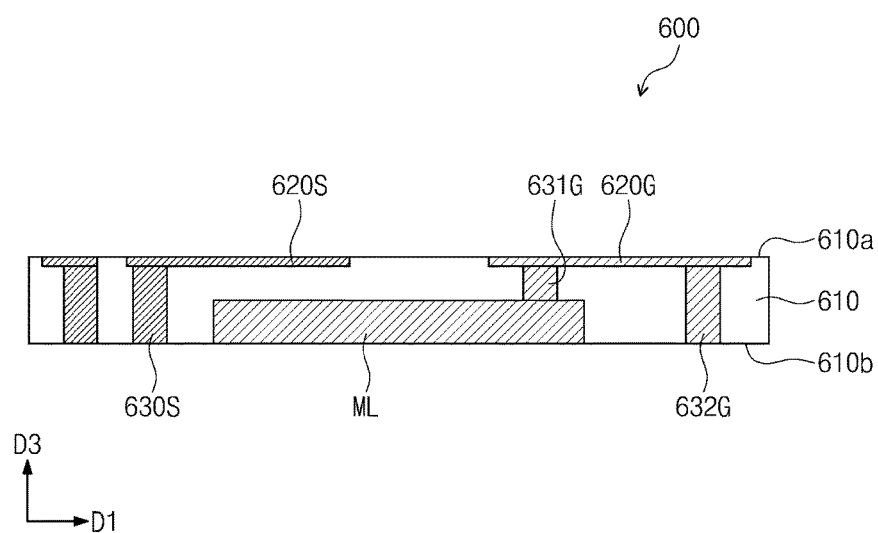

As shown in FIG. 8B, the interposer layer 600 may be prepared to include the insulation layer 610, the metal layer ML, metal patterns 620G and 620S, and metal vias 631G, 632G and 630S. The metal layer ML may be provided in the interposer layer 600. For example, the metal layer ML may be disposed on the second surface 610b of the insulation layer 610. The metal patterns 620G and 620S may be provided on the first surface 610a of the insulation layer 610. A metal ground pattern 620G may be insulated from a metal signal pattern 620S.

A first metal ground via 631G, a second metal ground via 632G, and metal signal vias 630S may be provided in the insulation layer 610. The first metal ground via 631G may be interposed between and connected to the metal layer ML and the metal ground pattern 620G. The second metal ground via 632G may be disposed on the ground pattern 620G and spaced apart from the metal layer ML in the first direction D1. The second metal ground via 632G may have a surface which is exposed through the insulation layer 610. The metal signal vias 630S may have surfaces which are exposed through the insulation layer 610.

Figure 8C:
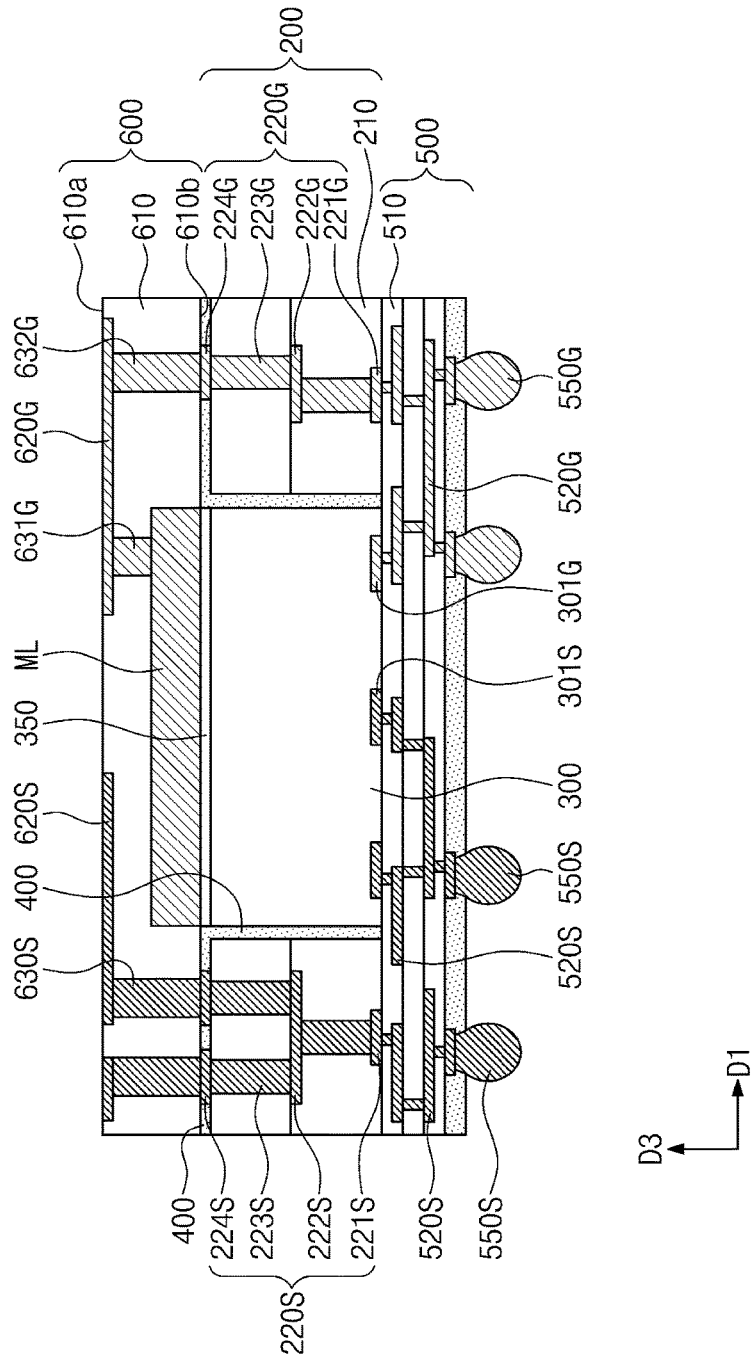

As shown in FIG. 8C, the interposer layer 600 of FIG. 8B may be disposed on the first semiconductor chip 300 and the interconnect substrate 200 of FIG. 8A. In this step, the second surface 610b of the insulation layer 610 may be disposed to face toward the first semiconductor chip 300 and thus the metal layer ML may be provided on the first semiconductor chip 300. The second metal ground via 632G and the metal signal vias 630S may be respectively connected to the upper ground pad 224G and the upper signal pads 224S. The metal layer ML may be grounded through the first metal ground via 631G, the metal ground pattern 620G, the second metal ground via 632G, the ground patterns 220G, the ground conductive pattern 520G, and the ground terminal 550G. A first package P109 may thus be fabricated.

Figure 8D:
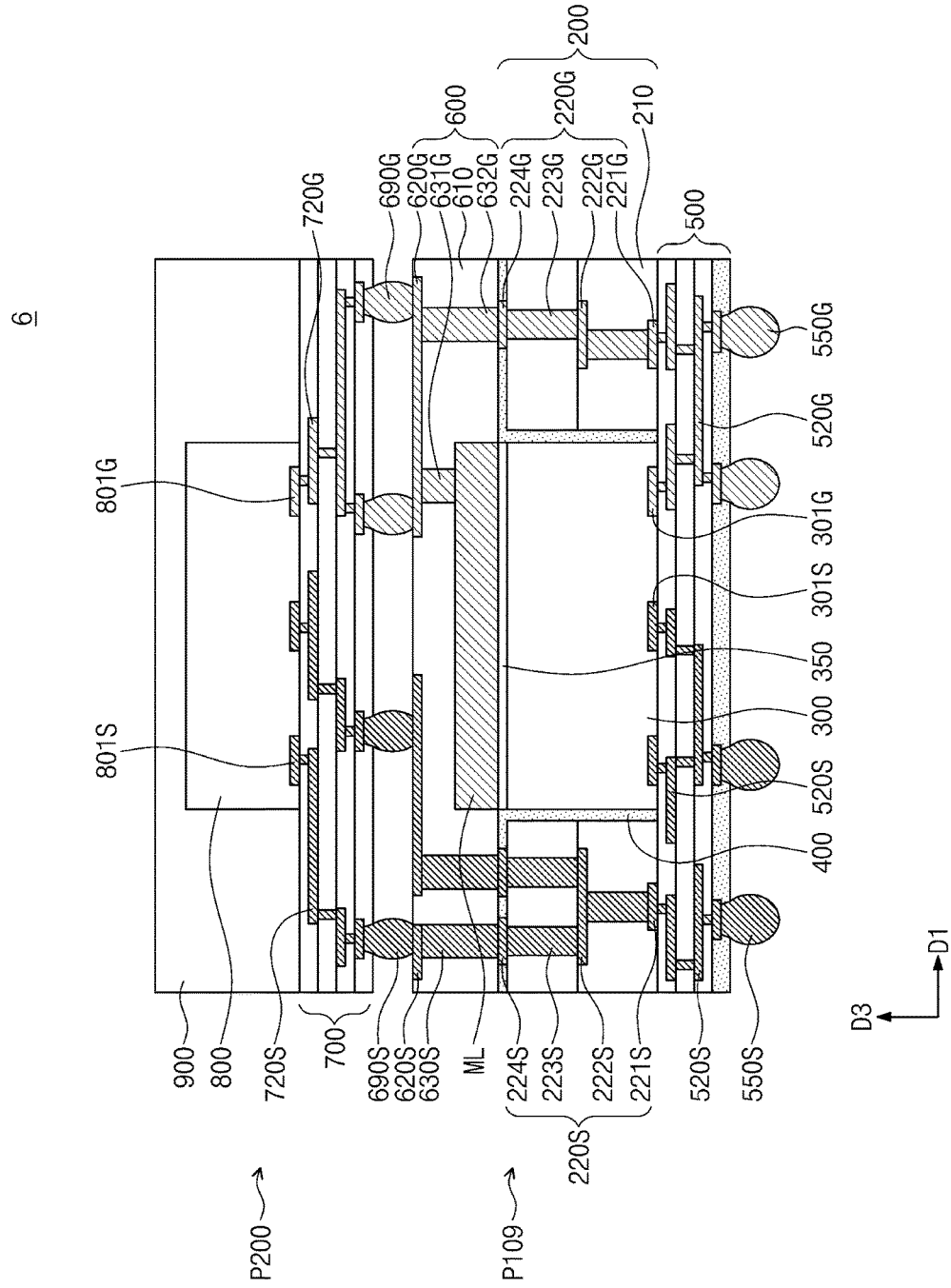

As shown in FIG. 8D, the second package P200 may be mounted on the first package P109 of FIG. 8C so that a semiconductor package 6 may be manufactured. An electrical connection between the second semiconductor chip 800 and the second substrate 700 may be substantially the same as that discussed in FIG. 7D. The interconnect terminals 690G and 690S may be formed between the second package P200 and the interposer layer 600. The ground interconnect terminal 690G and the signal interconnect terminal 690S may be respectively connected to the metal ground pattern 620G and the metal signal pattern 620S. The second package P200 may therefore be electrically connected to the first package P109 through the interposer layer 600.

Figure 9A:
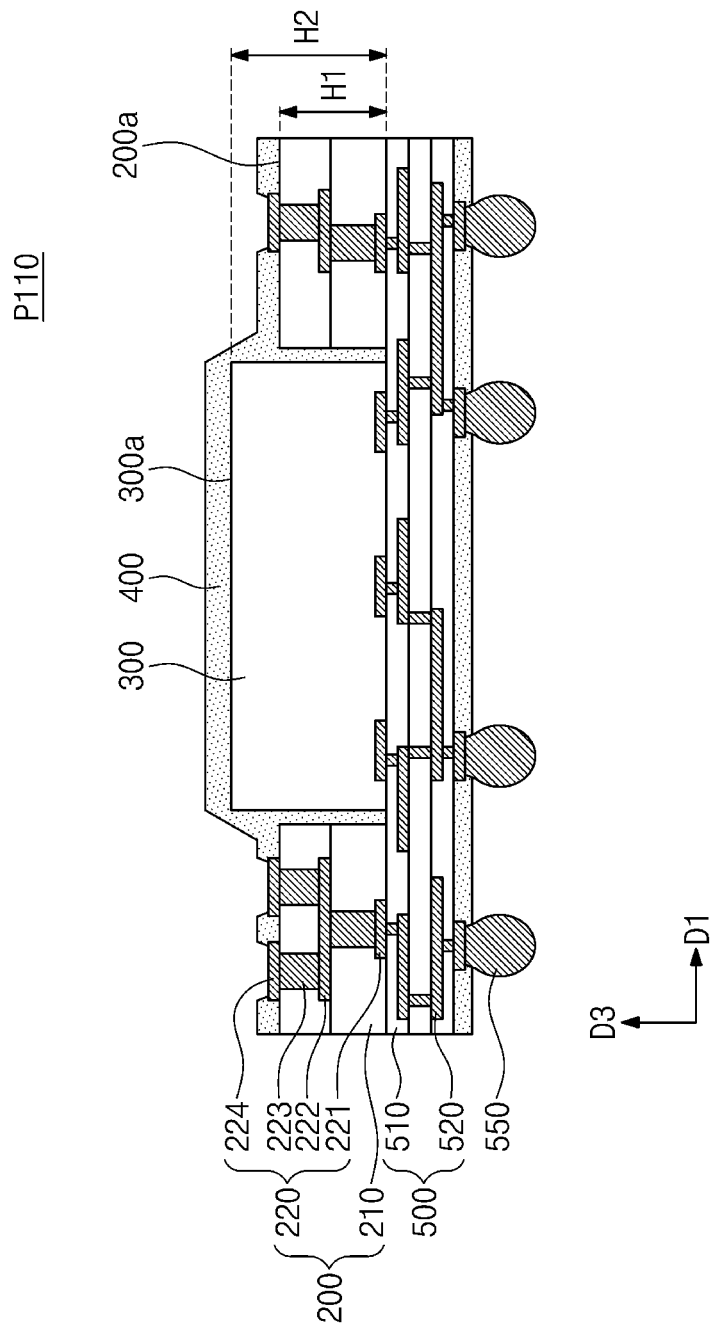
FIG. 9A is a cross-sectional view, corresponding to cross-sectional view taken along line II-II' of FIG. 1B, illustrating a first package according to exemplary embodiments.

FIG. 9A is a cross-sectional view taken along line II-II' of FIG. 1B, illustrating a first package P110 according to exemplary embodiments. A repetitive description of the same or similar components described above may be omitted in the description below.

As shown in FIG. 9A together with FIG. 1B, a first package P110 may include the first substrate 500, the first semiconductor chip 300, the interconnect substrate 200, and the first mold layer 400.

The interconnect substrate 200 may have a height H1 lower than a height H2 of the first semiconductor chip 300. The top surface 200a of the interconnect substrate 200 may be positioned at a level lower than that of the top surface 300a of the first semiconductor chip 300.

Figure 9B:
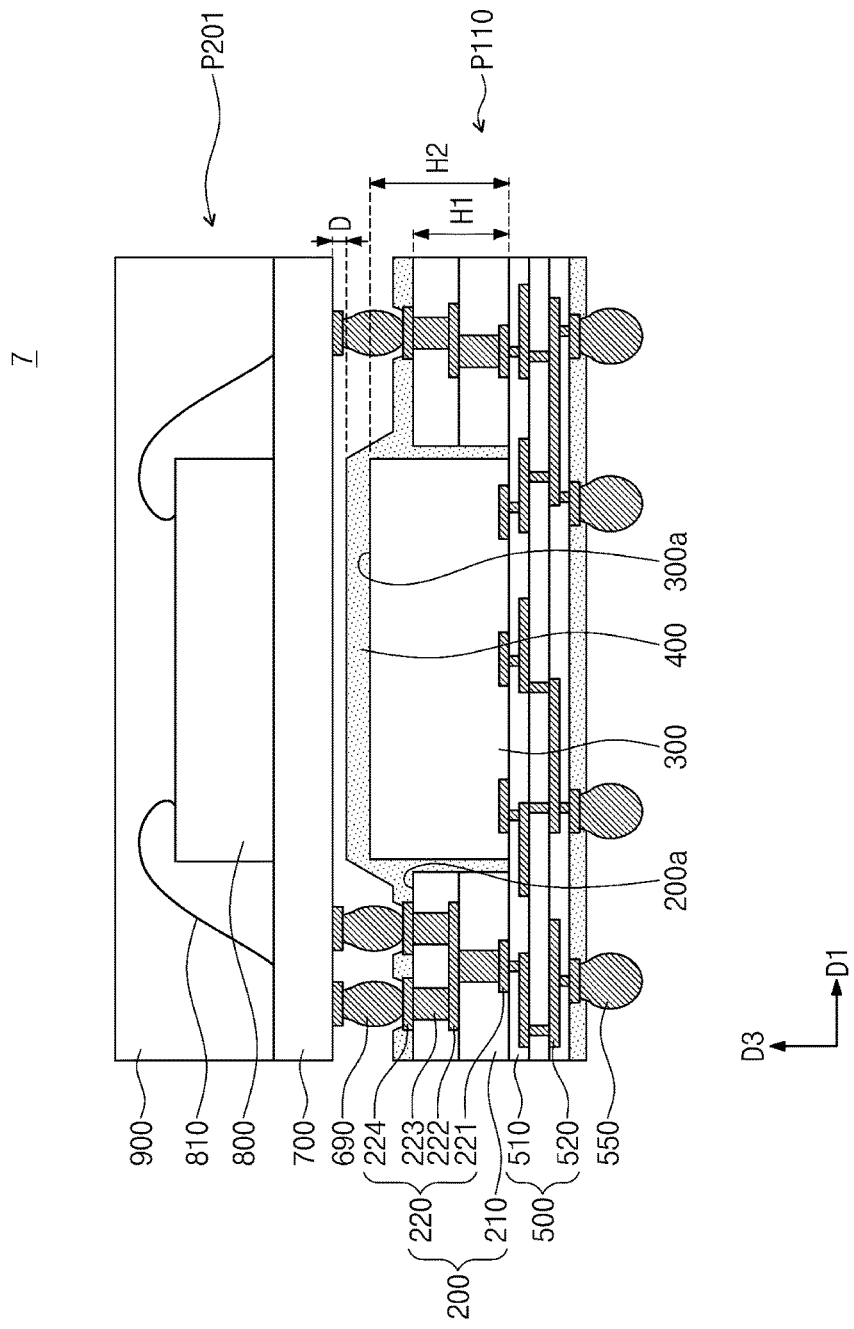
FIG. 9B is a cross-sectional view, corresponding to cross-sectional view taken along line II-II' of FIG. 1B, illustrating a semiconductor package according to exemplary embodiments.

FIG. 9B is a cross-sectional view taken along line II-II' of FIG. 1B, illustrating a semiconductor package according to exemplary embodiments. A repetitive description of the same or similar components described above may be omitted in the following description.

As shown in FIG. 9B together with FIG. 1B, a semiconductor package 7 may include a second package P201 mounted on the first package P110 of FIG. 9A. The second package P201 may include the second substrate 700, the second semiconductor chip 800, and the second mold layer 900. The second semiconductor chip 800 may be electrically connected to the second substrate 700 through a bonding wire 810. Multiple second semiconductor chips 800 may be provided (not shown). The interconnect terminals 690 may be provided between the upper pads 224 and the second substrate 700. The interconnect terminals 690 may be connected to the upper pads 224 such that the second package P201 may be electrically connected to the first package P110.

As the interconnect substrate 200 has the height H1 that is relatively small, the second substrate 700 may be disposed close to the first mold layer 400 on the first semiconductor chip 300. For example, the second substrate 700 may be spaced apart from the first mold layer 400 on the first semiconductor chip 300 by an interval D less than about 30 μm. Therefore, the semiconductor package 7 may be compact or small in size.

Figure 10A:
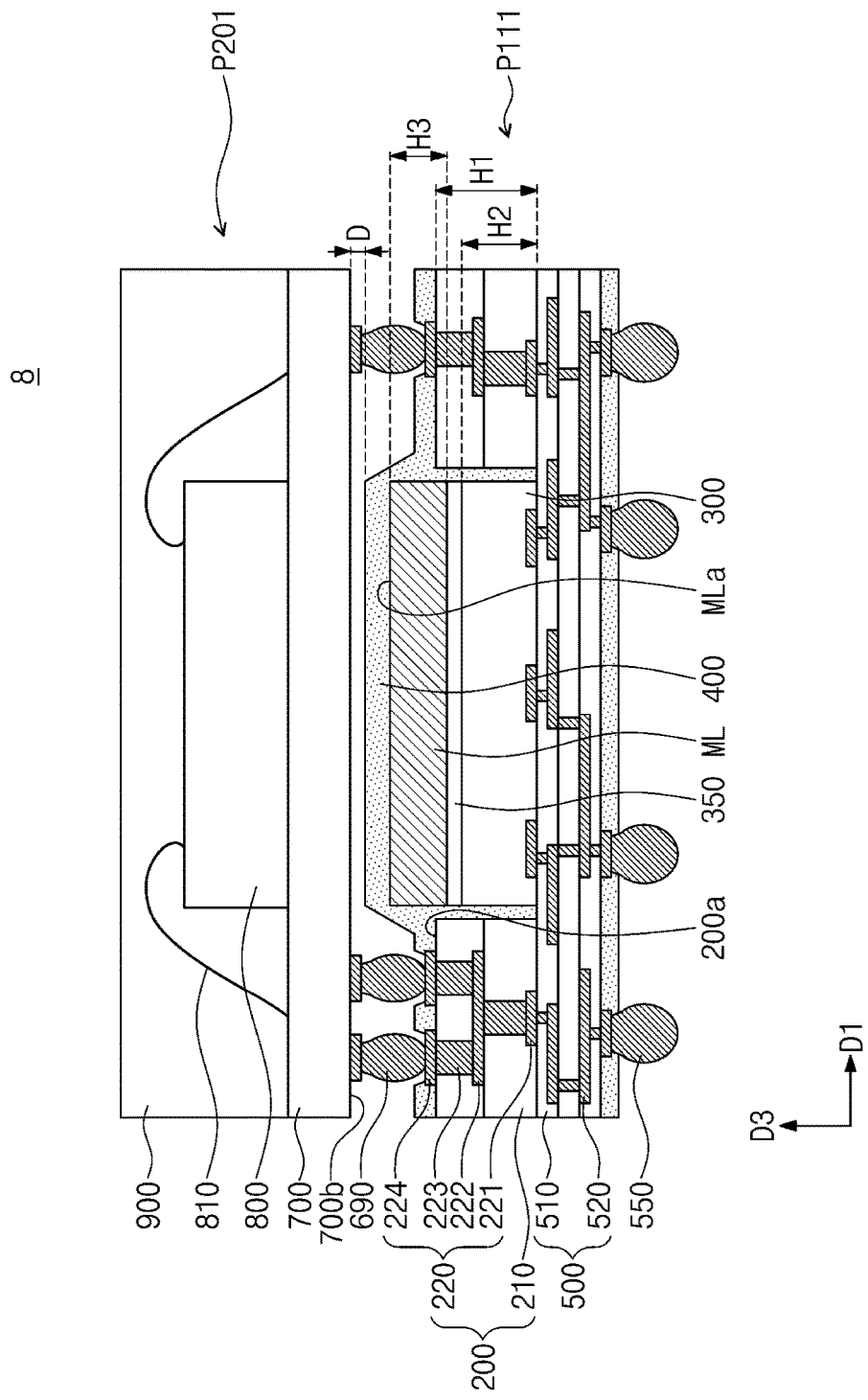
FIG. 10A is a cross-sectional view, corresponding to cross-sectional view taken along line II-II' of FIG. 1B, illustrating a semiconductor package according to exemplary embodiments.

FIG. 10A is a cross-sectional view taken along line II-II' of FIG. 1B, illustrating a semiconductor package according to exemplary embodiments. A repetitive description of the same or similar described components described above may be omitted from the following description.

As shown in FIG. 10A together with FIG. 1B, a semiconductor package 8 may include a first package P111 and a second package P201. The first package P111 may include the adhesive layer 350 and the metal layer ML in addition to the first substrate 500, the first semiconductor chip 300, the interconnect substrate 200, and the first mold layer 400. The adhesive layer 350 and the metal layer ML may be provided on the first semiconductor chip 300. The metal layer ML may prevent or reduce warpage of the first package P111. Heat generated from the first semiconductor chip 300 may be rapidly exhausted outside through the metal layer ML. Alternatively, the adhesive layer 350 may be omitted.

The height H1 of the interconnect substrate 200 may be relatively small. For example, the height H1 of the interconnect substrate 200 may be less than a sum of the height H2 of the first semiconductor chip 300 and a height H3 of the metal layer ML. The top surface 200a of the interconnect substrate 200 may be positioned at a level lower than that of a top surface MLa of the metal layer ML. Thus, the interval D between the second substrate 700 and the first mold layer 400 may be less than about 30 μm. The semiconductor package 8 may be compact or small in size.

Figure 10B:
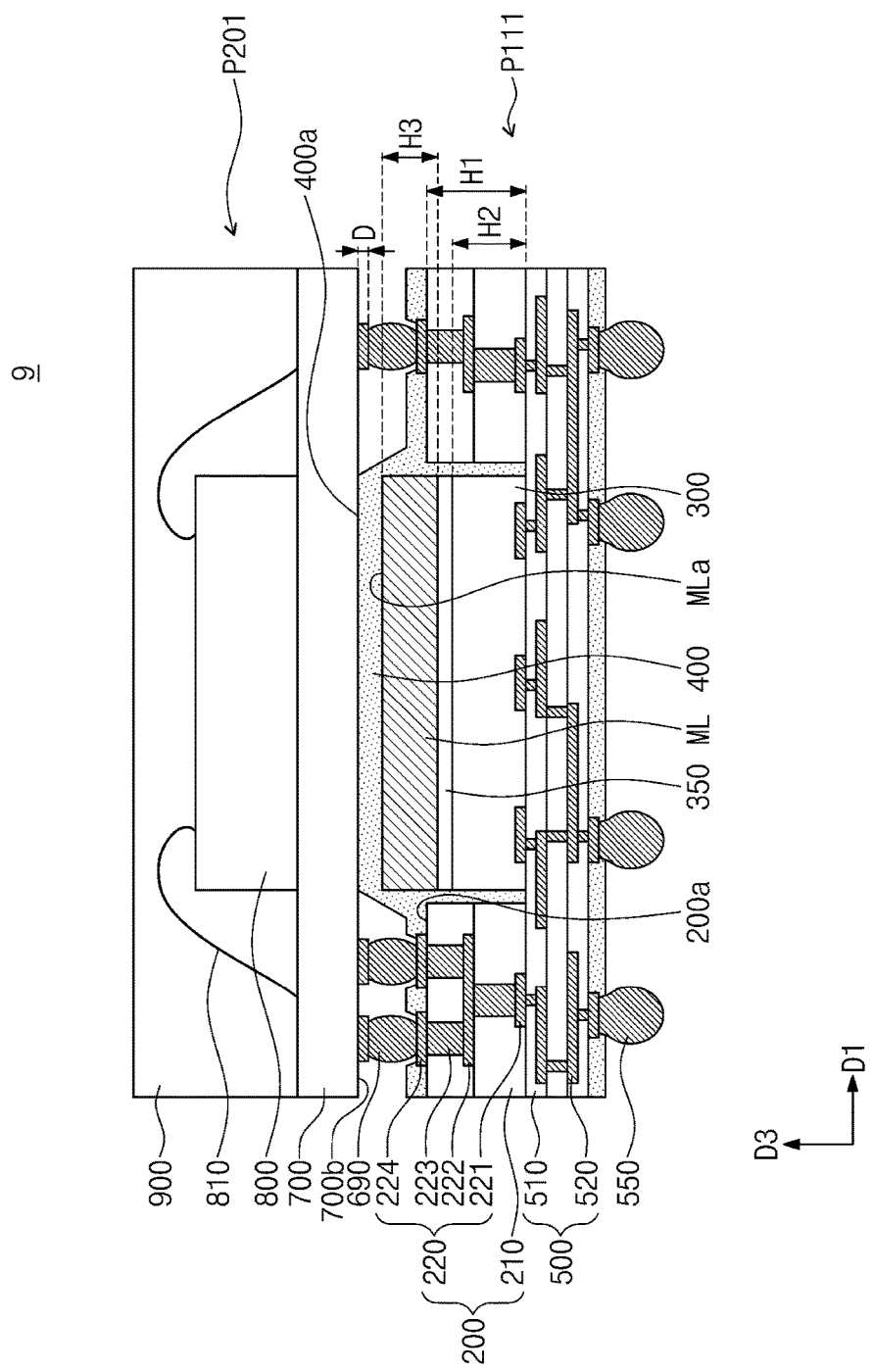
FIG. 10B is a cross-sectional view, corresponding to cross-sectional view taken along line II-II' of FIG. 1B, illustrating a semiconductor package according to exemplary embodiments.

FIG. 10B is a cross-sectional view taken along line II-II' of FIG. 1B, illustrating a semiconductor package according to exemplary embodiments. A repetitive description of the same or similar components described above may be omitted from the following description.

As shown in FIG. 10B together with FIG. 1B, a semiconductor package 9 may include the first package P111 and the second package P201. The first semiconductor chip 300, the interconnect substrate 200, the adhesive layer 350, and the metal layer ML may be disposed in the same manner as discussed in FIG. 10A.

As the interconnect substrate 200 has the height H1 that is relatively small, the first mold layer 400 on the first semiconductor chip 300 may have a top surface 400a that physically contacts a bottom surface 700b of the second substrate 700. The semiconductor package 9 may therefore be compact or small in size. The first semiconductor chip 300 may generate heat when the semiconductor package 9 is operated. The first semiconductor chip 300, the first mold layer 400, the adhesive layer 350, the metal layer ML, and the second package P201 may have a thermal conductively greater than that of air. The first mold layer 400 may be in physical contact with the second substrate 700 such that heat generated from the first semiconductor chip 300 may be rapidly transmitted to the second package P201.

According to exemplary embodiments, the metal layer may be disposed on the top surface of the semiconductor chip such that it may be possible to prevent the semiconductor package from warpage. The redistribution pattern may be used as the substrate and thus the semiconductor package may become compact-sized.

Although the present invention has been described in connection with exemplary embodiments illustrated in the accompanying drawings, it is not limited thereto. It will be apparent to those skilled in the art that various substitution, modifications and changes may be made thereto without departing from the scope and spirit of the invention as set forth in the below appended claims.

What is claimed is:
1. A semiconductor package comprising:
a redistribution substrate;
an interconnect substrate on the redistribution substrate, the interconnect substrate including a hole penetrating thereinside;
a semiconductor chip on the redistribution substrate and in the hole of the interconnect substrate;
a metal layer on the semiconductor chip; and
a mold layer in a gap between the semiconductor chip and the interconnect substrate, wherein the interconnect substrate includes base layer and a conductive member extending through the base layer, wherein a top surface of the interconnect substrate is positioned at a level lower than that of a top surface of the metal layer, wherein the mold layer covers the top surface of the interconnect substrate and the top surface of the metal layer, wherein the metal layer has a width and a planar shape substantially the same as those of the semiconductor chip, wherein the conductive member comprises:
a lower pad on a bottom surface of the interconnect substrate;
vias and a line pattern in the base layer; and
an upper pad on the top surface of the interconnect substrate;

wherein the upper pad is connected to the lower pad through the vias and the line pattern, and wherein the upper pad is not aligned with the lower pad in a vertical direction.

2. The semiconductor package of claim 1, further comprising an adhesive layer connecting and in contact with the semiconductor chip and the metal layer,
wherein the adhesive layer includes a thermosetting polymer or a thermoplastic polymer.

3. The semiconductor package of claim 1, wherein the redistribution substrate comprises insulative patterns and a conductive pattern between the insulative patterns,
wherein the metal layer and the conductive pattern have a coefficient of thermal expansion greater than that of the semiconductor chip, and
wherein the metal layer has a thermal conductivity greater than that of the semiconductor chip.

4. The semiconductor package of claim 1, further comprising an upper package on the interconnect substrate and the metal layer,
wherein the upper package is electrically connected to the conductive member.

5. A semiconductor package comprising:
a substrate;
a semiconductor chip on the substrate;
a first metal layer on the semiconductor chip;
an interconnect substrate that is disposed side by side with the semiconductor chip on the substrate and surrounds the semiconductor chip in plan view;
a mold layer in a gap between the semiconductor chip and the interconnect substrate; and
a carbon layer including at least one of carbon nanotube, graphene, and graphite disposed on and contacting a top surface of the first metal layer,
wherein the interconnect substrate includes a base layer and a conductive member extending through the base layer,
wherein the carbon layer has a width and a planar shape substantially the same as a width and a planar shape of the first metal layer, respectively,
wherein the mold layer covers the top surface of the first metal layer and a top surface of the interconnect substrate, and
wherein the width and the planar shape of the first metal layer are substantially the same as those of the semiconductor chip.

6. The semiconductor package of claim 5,
wherein the interconnect substrate comprises a hole penetrating thereinside, and wherein the semiconductor chip is provided in the hole of the interconnect substrate.

7. The semiconductor package of claim 6, wherein a plurality of semiconductor chips are provided in the hole.

8. The semiconductor package of claim 5, wherein the conductive member comprises a ground pattern and a signal pattern,
wherein the first metal layer extends onto and is connected to the ground pattern, and
wherein the first metal layer is insulated from the signal pattern.

9. The semiconductor package of claim 8, further comprising a second metal layer disposed on the semiconductor chip and spaced apart from the first metal layer,
wherein the second metal layer extends onto and is connected to the signal pattern, and
wherein the second metal layer is insulated from the ground pattern.

10. The semiconductor package of claim 5, further comprising an interposer layer on the interconnect substrate and the semiconductor chip,
wherein the first metal layer is provided in the interposer layer.

11. The semiconductor package of claim 10, wherein the interposer layer comprises:
an insulation layer including a first surface and a second surface facing each other, wherein the first metal layer is provided on the first surface of the insulation layer;
a metal pattern on the first surface of the insulation layer; and
metal vias that are provided in the insulation layer and respectively disposed on the first metal layer and the metal pattern.

12. The semiconductor package of claim 10, wherein the interposer layer comprises:
an insulation layer including a first surface and a second surface facing each other, wherein the first metal layer is provided on the first surface of the insulation layer;
a metal pattern on the second surface of the insulation layer; and
metal vias that penetrate the insulation layer and are respectively connected to the first metal layer and the metal pattern.

13. The semiconductor package of claim 5, wherein the interconnect substrate has a rectangular shape in plan view and is provided in plural on the substrate.

14. A semiconductor package comprising:
a redistribution substrate;
an interconnect substrate on the redistribution substrate, the interconnect substrate including a hole penetrating thereinside;
a semiconductor chip on the redistribution substrate and in the hole of the interconnect substrate;
a metal layer on the semiconductor chip; and
a mold layer in a gap between the semiconductor chip and the interconnect substrate,
wherein the interconnect substrate includes base layers and a conductive member extending through the base layers,
wherein a top surface of the interconnect substrate is positioned at a level even with or above that of a top surface of the metal layer, wherein the mold layer covers the top surface of the metal layer and the top surface of the interconnect substrate, and wherein the metal layer has a width and a planar shape substantially the same as those of the semiconductor chip.

15. The semiconductor package of claim 14, further comprising an adhesive layer connecting and in contact with the semiconductor chip and the metal layer, wherein the adhesive layer includes a thermosetting polymer or a thermoplastic polymer.

16. The semiconductor package of claim 14, wherein the conductive member comprises:
- a lower pad on a bottom surface of the interconnect substrate;
- a line pattern between the base layers;
- vias penetrating the base layers; and
- an upper pad on the top surface of the interconnect substrate, wherein the upper pad is connected to the lower pad through the vias and the line pattern, wherein the upper pad is not aligned with the lower pad.

17. The semiconductor package of claim 14, wherein the redistribution substrate comprises insulative patterns and a conductive pattern between the insulative patterns, wherein the metal layer and the conductive pattern have a coefficient of thermal expansion greater than that of the semiconductor chip, and wherein the metal layer has a thermal conductivity greater than that of the semiconductor chip.

18. The semiconductor package of claim 1, wherein the metal layer is in contact with an upper surface of the semiconductor chip.

19. The semiconductor package of claim 1, further comprising a seed layer formed on and in contact with an upper surface of the semiconductor chip.

* * * * *